(12) United States Patent
Onoda et al.

(10) Patent No.: US 7,939,397 B2
(45) Date of Patent: May 10, 2011

(54) METHOD OF MANUFACTURING SEMICONDUCTOR DEVICE

(75) Inventors: Michihiro Onoda, Kawasaki (JP); Takayuki Matsumoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/362,161

(22) Filed: Jan. 29, 2009

(65) Prior Publication Data
US 2009/0280613 A1 Nov. 12, 2009

(30) Foreign Application Priority Data

May 9, 2008 (JP) .................................. 2008-124086

(51) Int. Cl.
*H01L 21/336* (2006.01)
*H01L 21/8234* (2006.01)
*H01L 21/8238* (2006.01)
*H01L 21/44* (2006.01)

(52) U.S. Cl. ........ 438/197; 438/199; 438/208; 438/216; 438/659; 438/664; 257/E21.633; 257/E21.637; 257/E21.639

(58) Field of Classification Search ........... 257/E21.633, 257/E21.637, E21.639
See application file for complete search history.

(56) References Cited

U.S. PATENT DOCUMENTS

| 6,287,912 | B1 * | 9/2001 | Asakura et al. | 438/241 |
|---|---|---|---|---|
| 7,285,838 | B2 * | 10/2007 | Ohkawa et al. | 257/500 |
| 7,419,864 | B2 * | 9/2008 | Ohkawa et al. | 438/199 |
| 7,589,383 | B2 * | 9/2009 | Yanase | 257/351 |
| 7,816,201 | B2 * | 10/2010 | Kato et al. | 438/217 |
| 2006/0145286 | A1 * | 7/2006 | Ohkawa et al. | 257/500 |
| 2007/0040210 | A1 * | 2/2007 | Matsunaga | 257/315 |
| 2008/0087980 | A1 * | 4/2008 | Cho | 257/506 |

FOREIGN PATENT DOCUMENTS

| JP | 04-171942 A | 6/1992 |
|---|---|---|
| JP | 2003-218232 A | 7/2003 |
| JP | 2006-203225 A | 8/2006 |

* cited by examiner

*Primary Examiner* — Charles Garber
*Assistant Examiner* — Mohsen Ahmadi
(74) *Attorney, Agent, or Firm* — Westerman, Hattori, Daniels & Adrian, LLP

(57) ABSTRACT

A method of manufacturing a semiconductor device includes forming a first semiconductor pattern which is covered with a first insulating film over a first active region, forming a second semiconductor pattern over a second active region, forming a second insulating film over the first insulating film and the first and second semiconductor patterns, forming an opening whose depth reaches the first semiconductor pattern by etching the second insulating film and the first insulating film, forming sidewalls on side surfaces of the second semiconductor pattern by patterning the second insulating film, forming a metal film over the first and second semiconductor patterns respectively, and forming silicide layers by reacting the first and second semiconductor patterns with the metal film.

12 Claims, 46 Drawing Sheets

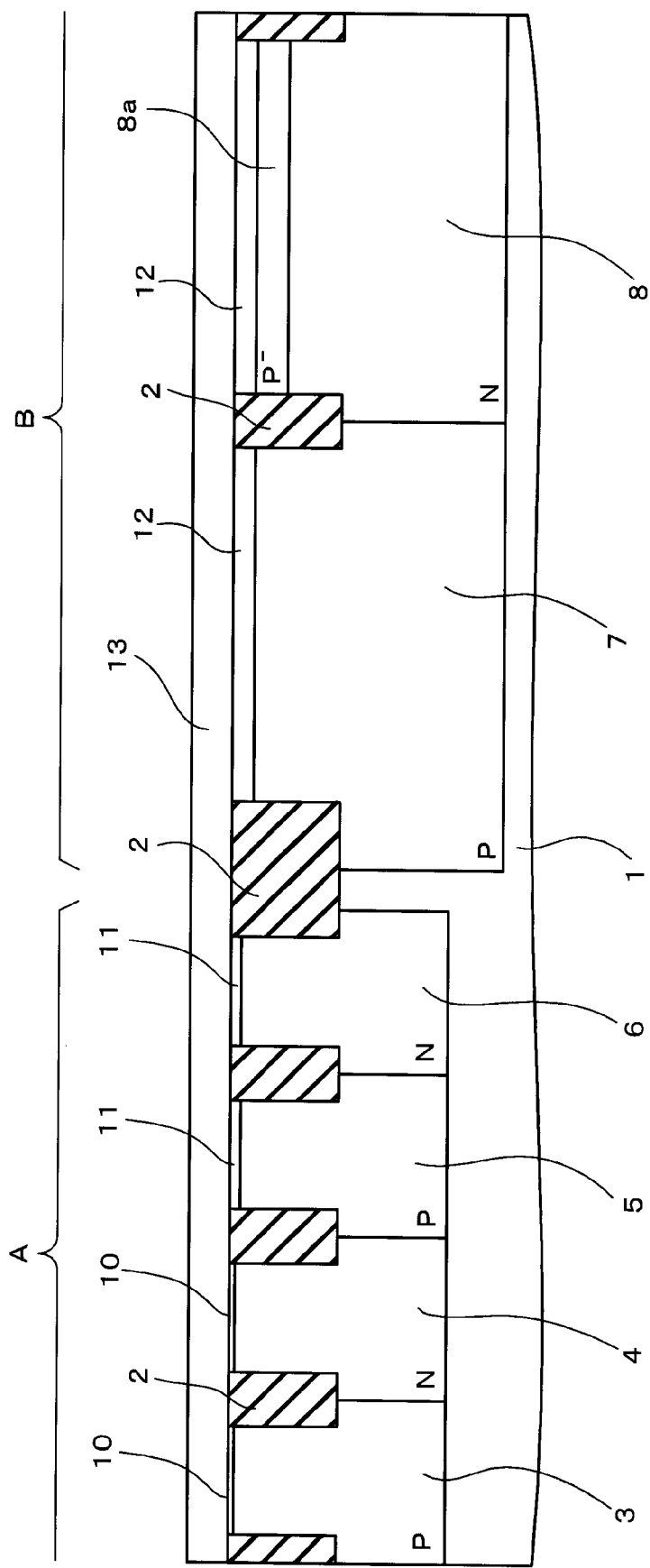

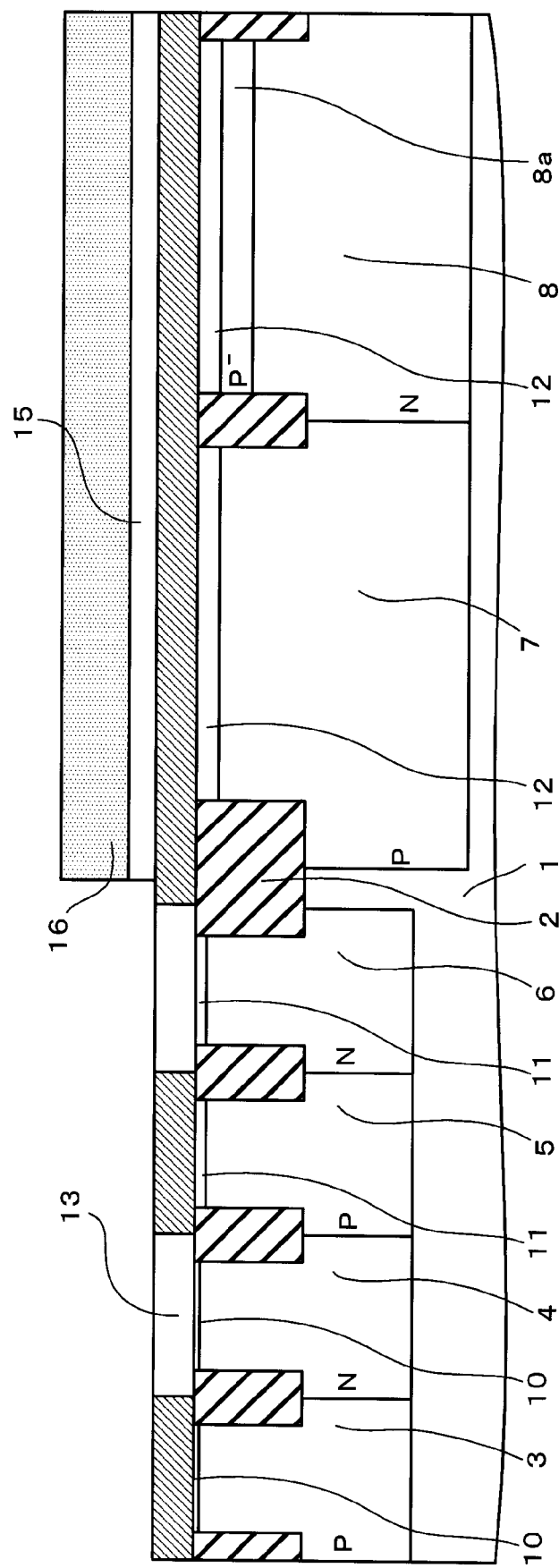

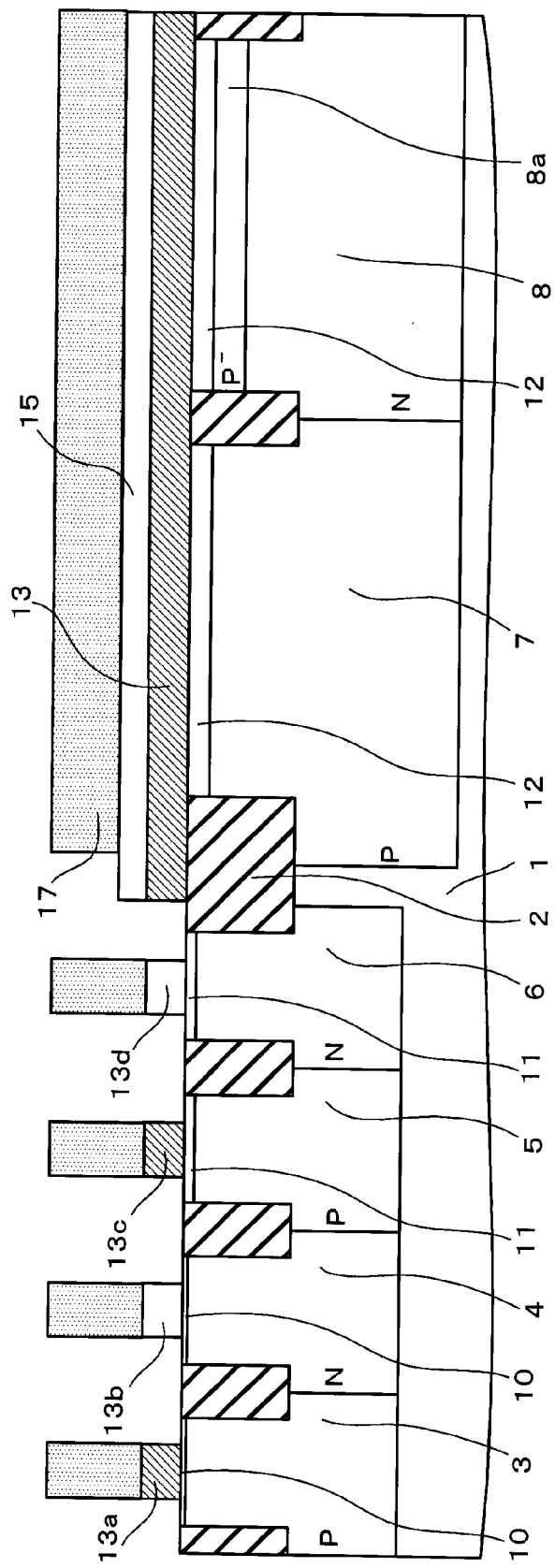

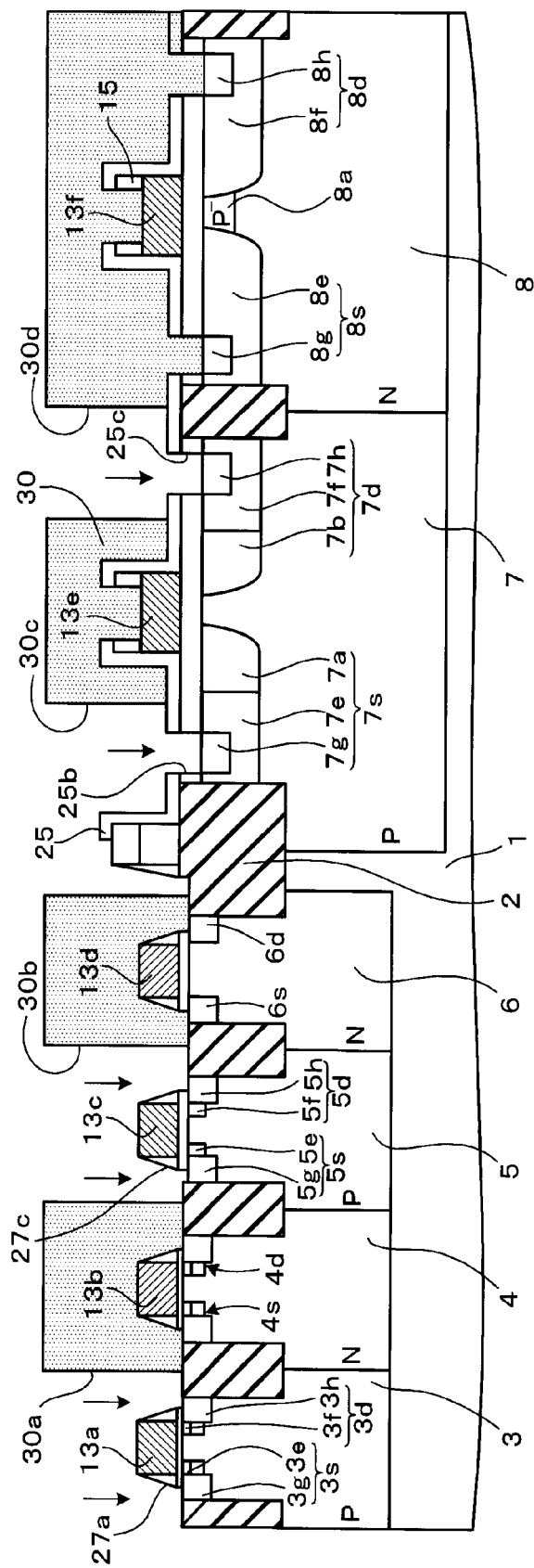

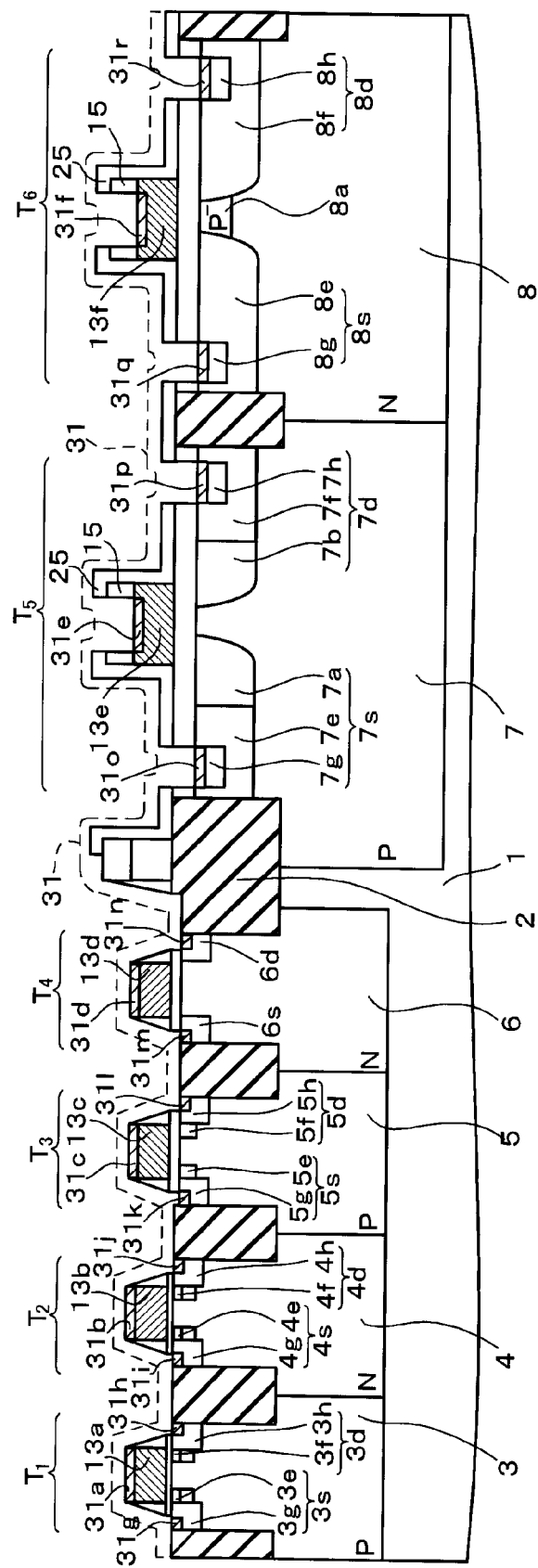

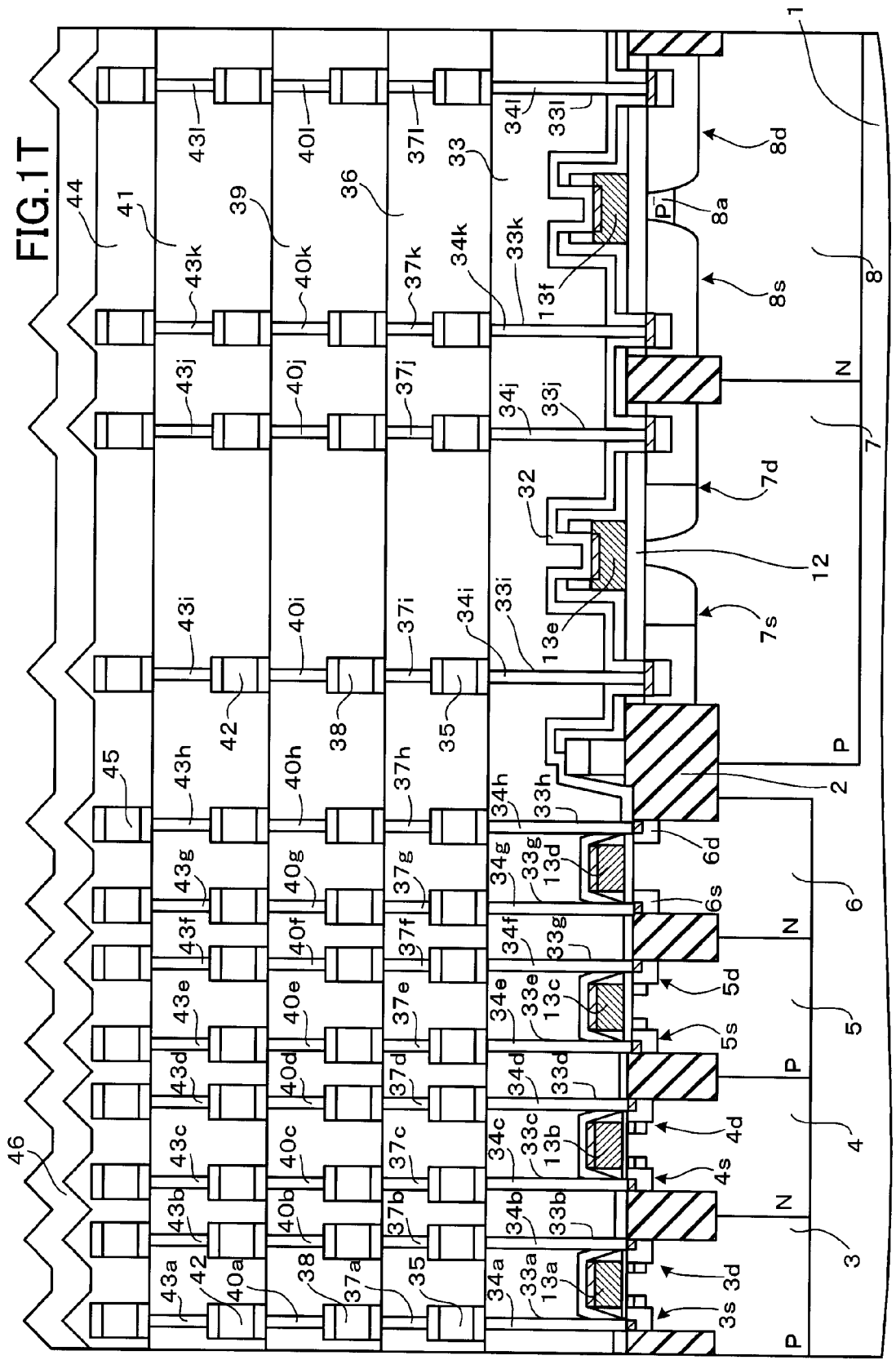

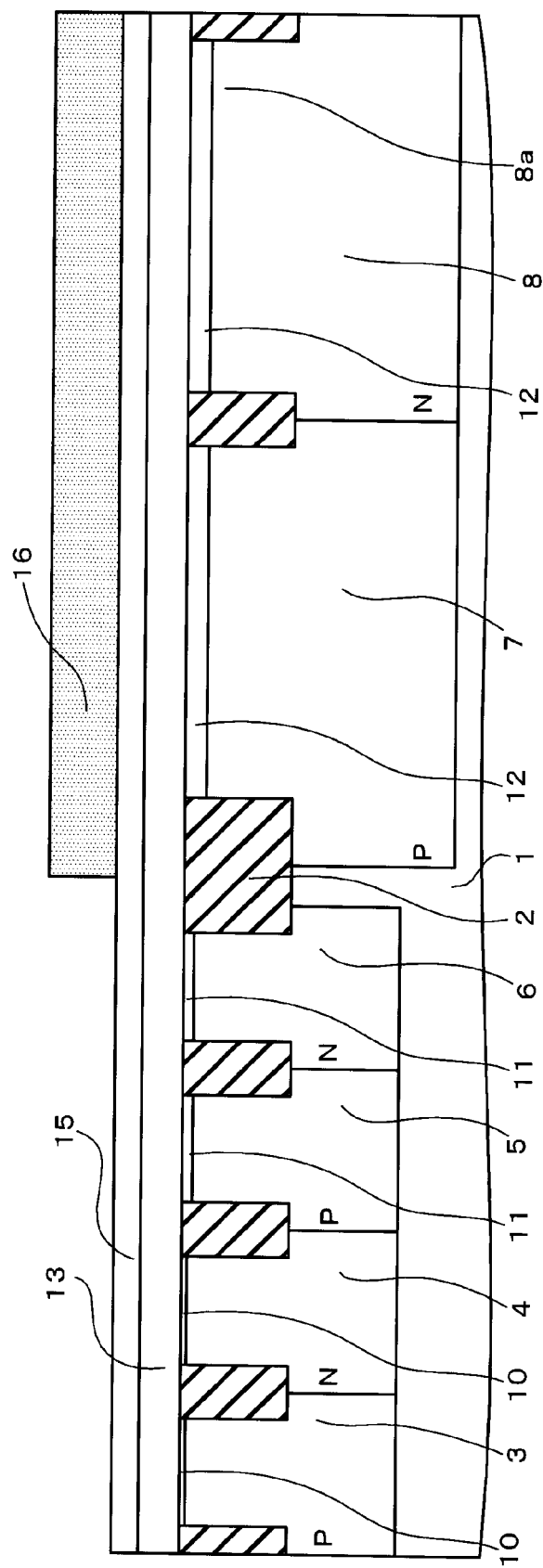

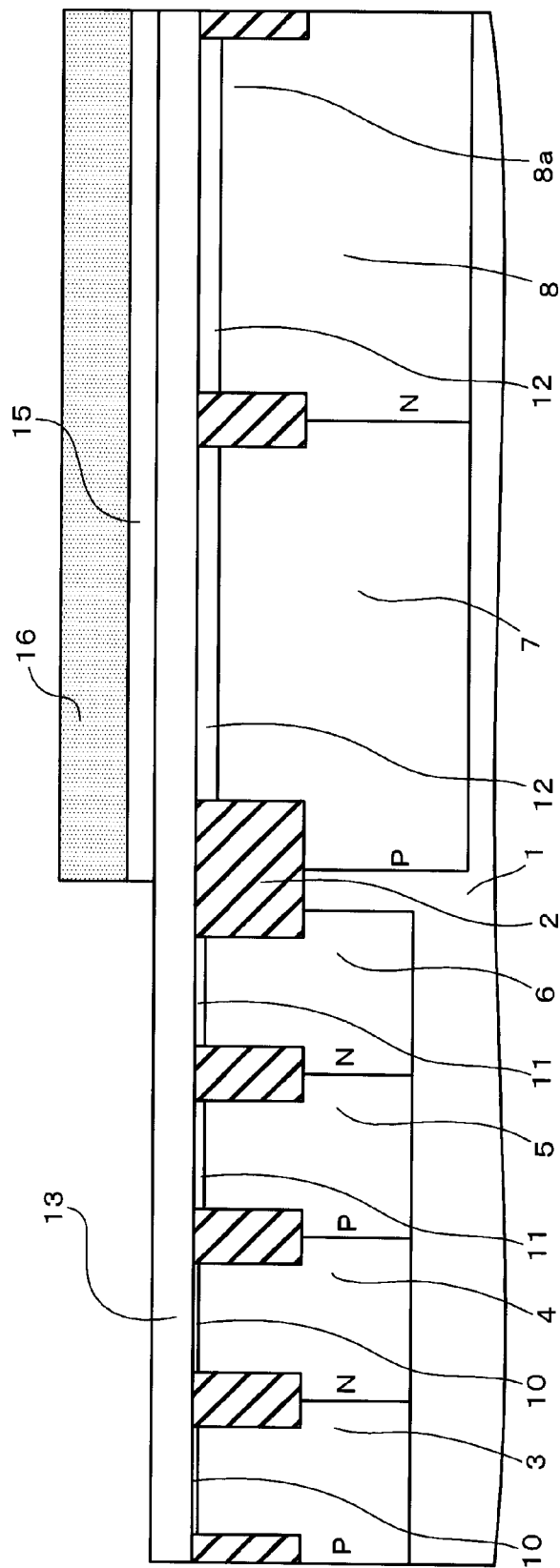

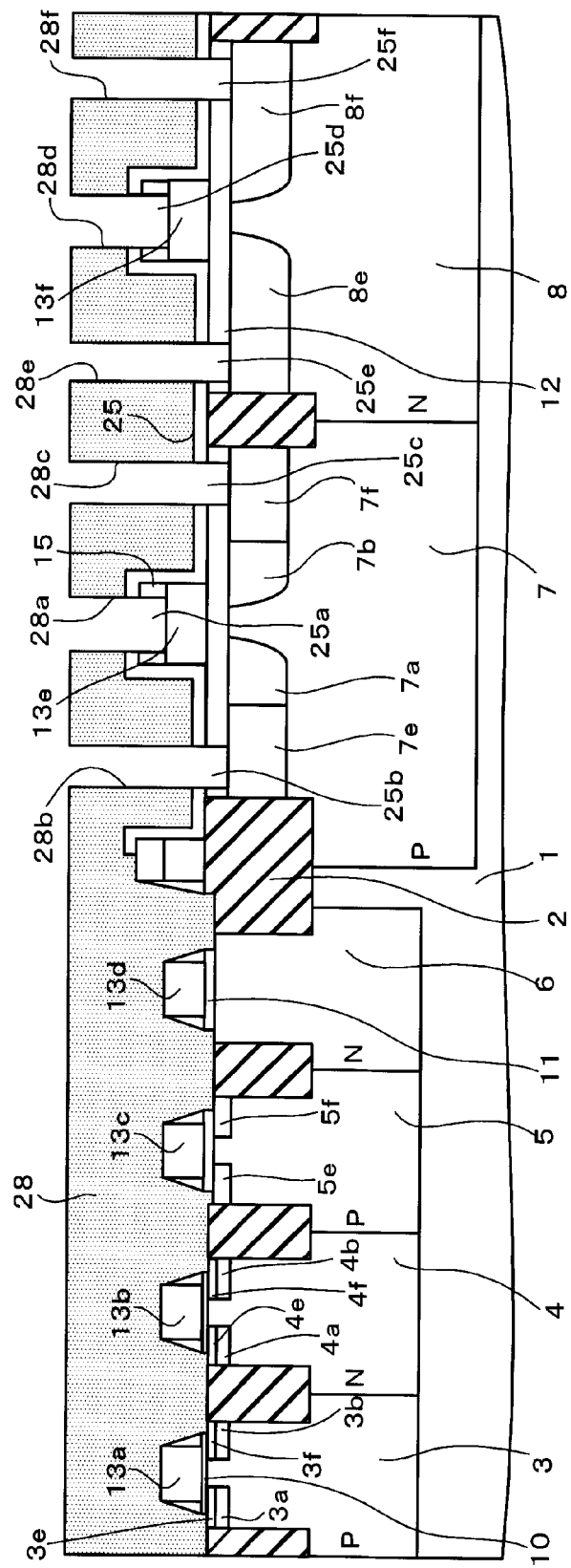

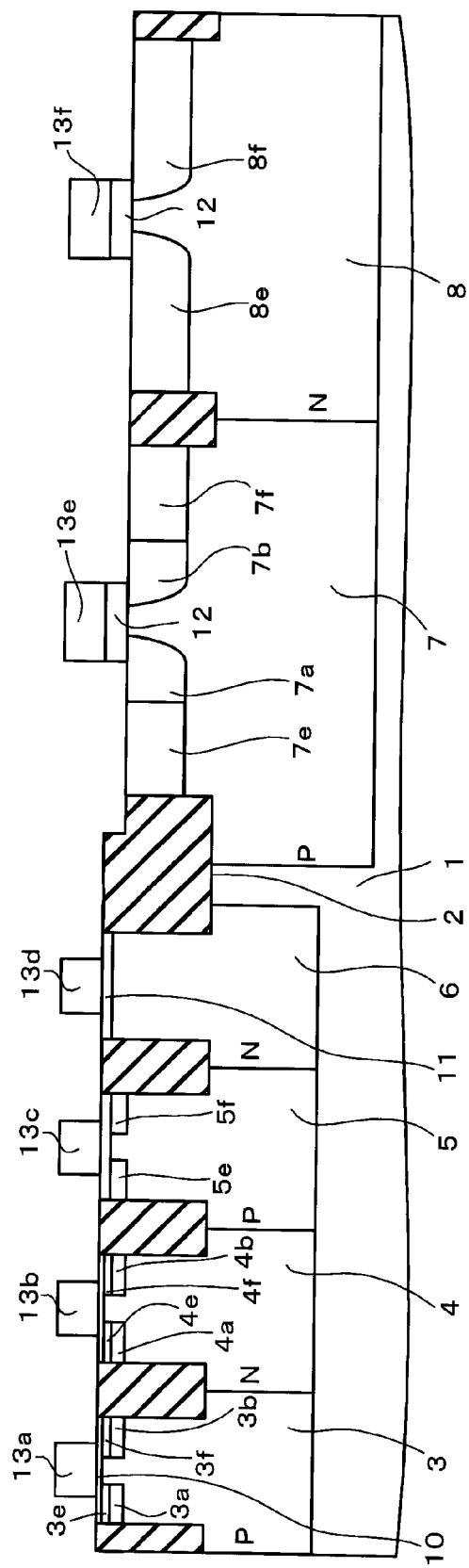

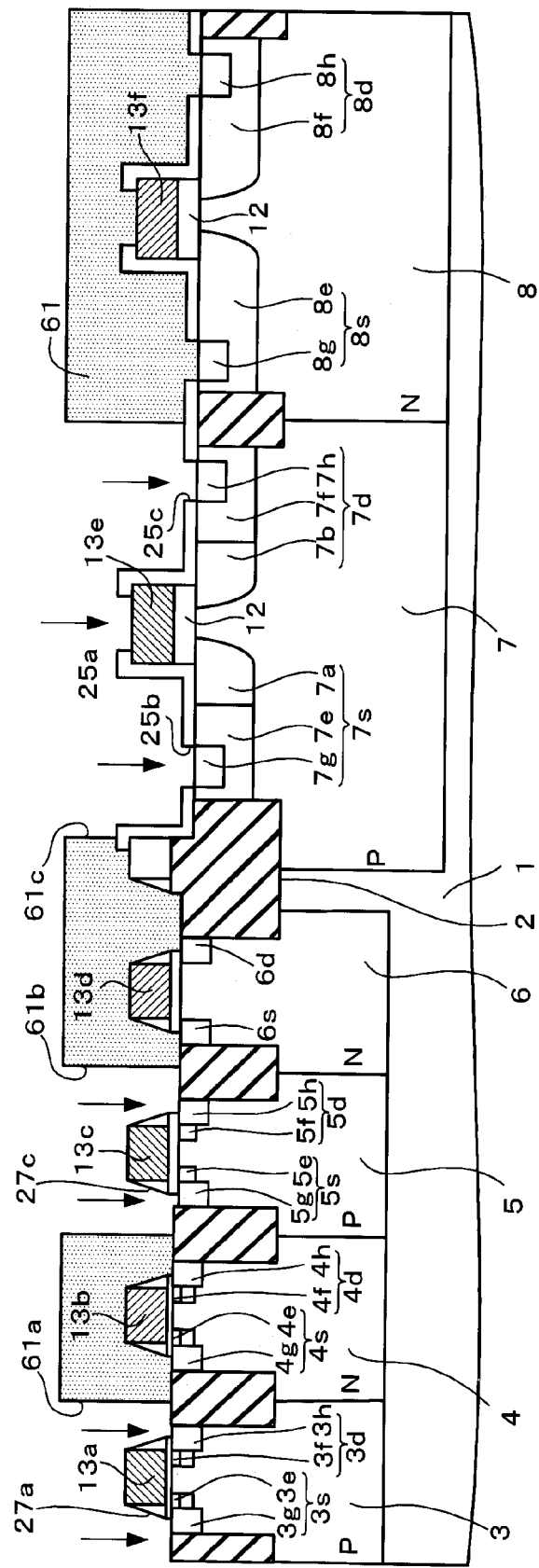

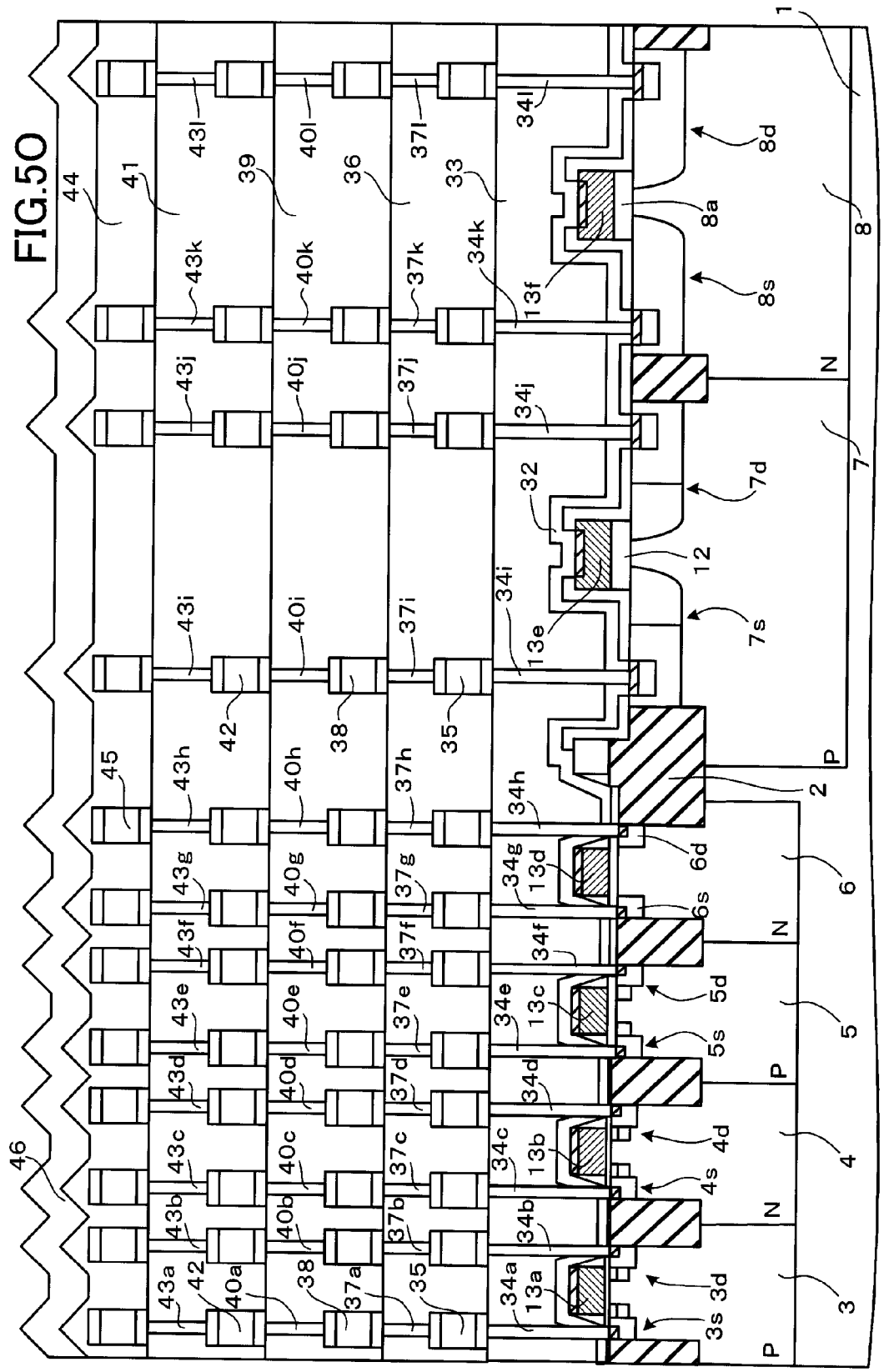

METHOD OF MANUFACTURING SEMICONDUCTOR DEVICE

CROSS-REFERENCE TO RELATED APPLICATION

This application is based upon and claims the benefit of the prior Japanese Patent Application NO. 2008-124086, filed on May 9, 2008, the entire content of which is incorporated herein by reference.

FIELD

The Present invention relates to a method of manufacturing a semiconductor device.

BACKGROUND

In the technical fields such as Information and Communication Technology, Multimedia Technology, and the like, a system LSI which combines a plurality of functional circuits such as logic circuit, memory circuit, image processing circuit, CPU, and the like, for example, on a single semiconductor chip is employed. Thus, data transfer rate of the function circuits can increase, and the size of the function circuits can be miniaturized, and also power consumption of a system can decrease.

A plurality of transistors whose respective driving voltages are different are provided not only in such a system LSI but also in a semiconductor chip. In a low-voltage transistor among these transistors, a gate electrode is formed thinner to make LSI miniaturized.

Meanwhile, in a high-voltage transistor, deep source/drain regions are formed to prevent degradation of the hot-carrier injection. When the deep source/drain regions are formed by the ion implantation method, there is a risk such that ions may penetrate through the gate electrode and enter into a substrate. Therefore, in order to prevent the ion penetration, in some cases such a structure may be employed that the gate electrode is formed thick or an insulating film is stacked on the gate electrode.

Also, in order to improve a performance of the transistor, such a structure may be employed that a silicide layer is formed on the gate electrode.

SUMMARY

According to an aspect of the embodiment, a method of manufacturing a semiconductor device includes forming a first semiconductor pattern whose upper surface is covered with a first insulating film over a first active region of a semiconductor substrate, forming a second semiconductor pattern over a second active region of the semiconductor substrate, forming a second insulating film over the first insulating film and the first semiconductor pattern and the second semiconductor patterns, forming an opening portion reaching the first semiconductor pattern, in the second insulating film and the first insulating film, forming sidewalls on side surfaces of the second semiconductor pattern by etching the second insulating film, forming a metal film over the first semiconductor pattern and the second semiconductor pattern respectively, and forming a silicide layer over the first semiconductor pattern and the second semiconductor pattern respectively by reacting the first semiconductor pattern and the second semiconductor pattern with the metal film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A to 4J are sectional views illustrating steps of forming a semiconductor device according to a second embodiment of the present invention.

DESCRIPTION OF EMBODIMENTS

Figure 1B:
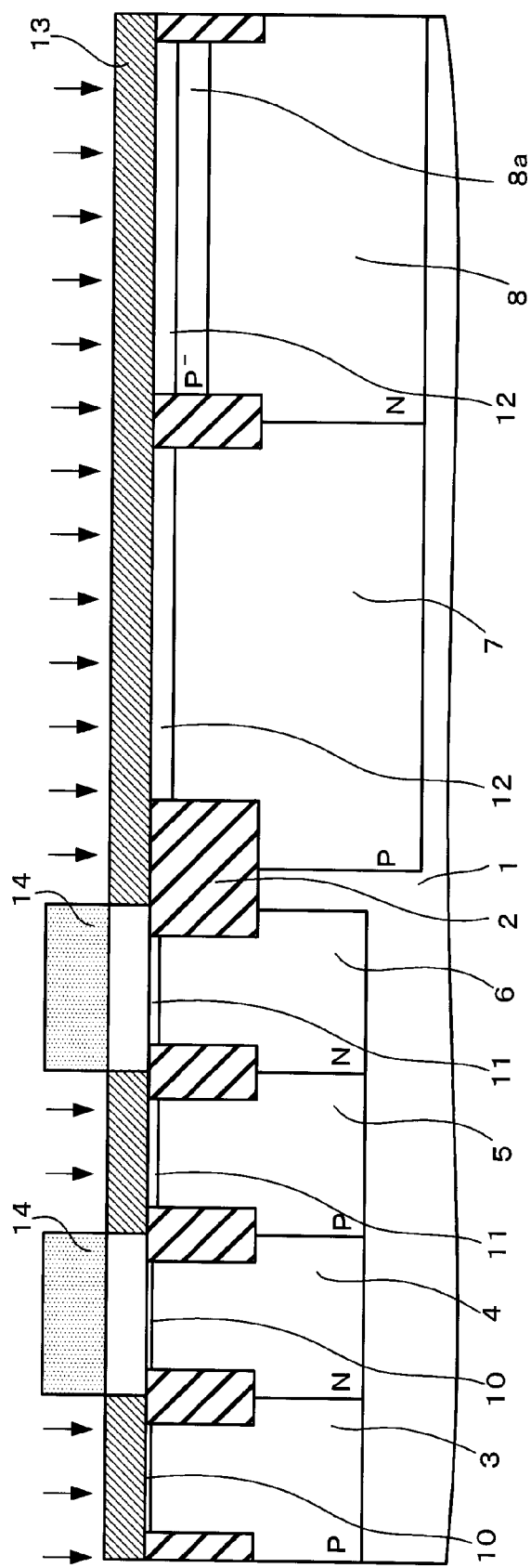
FIGS. 1A to 1T are sectional views illustrating steps of forming a semiconductor device according to a first embodiment of the present invention.

Embodiments of the present invention will be explained in detail with reference to the drawings below. In the following description, for purposes of explanation, specific nomenclature is set forth to provide a thorough understanding of the various inventive concepts disclosed herein. However, it will be apparent to those skilled in the art that these specific details may not be required in order to practice the various inventive concepts disclosed herein.

When a plurality of transistors being driven by different voltages respectively are formed in a single semiconductor chip, a structure that is suited to the transistors respectively is needed, and a method of manufacturing the semiconductor device that is suited to the transistors respectively is needed.

It is an object of the present invention to provide a method of manufacturing a semiconductor device, capable of enhancing throughput of production.

According to the present invention, a metal film is formed on a first semiconductor pattern through an opening portion in an insulating film and a second semiconductor pattern on whose side surfaces sidewalls are formed, and then silicide layers are formed by reacting the first and second semiconductor patterns with the metal film. Thus, a throughput for forming the silicide layers is improved.

Also, according to the present invention, an impurity is implanted into an active region while using a first semiconductor pattern whose upper surface is covered with a first insulating film as a mask, and then the first insulating film is removed. Next, the first semiconductor pattern and a semiconductor patter are covered with a second insulating film. Then an opening is formed on the first semiconductor pattern and the sidewall is formed on both sides of the second semiconductor pattern at the same time by etching parts of the second insulating film. Then, the silicide layer is formed on the first and second semiconductor patterns. Thus, a throughput for forming the silicide layers is improved.

Further, according to the present invention, an impurity is implanted into a first semiconductor pattern whose upper surface is covered with a first insulating film, and then a second insulating film is formed over the first insulating film and the first semiconductor pattern. Then, an opening is formed in the first and second insulating films on the first semiconductor pattern, and then the silicide layer is formed on the first semiconductor pattern through the opening. Thus a step of removing selectively the first insulating film that controls a depth of the impurity being implanted into the first semiconductor pattern can be unnecessary, and a throughput for forming the silicide layer is improved.

Embodiments of the present invention will be explained in detail with reference to the drawings hereinafter.

FIGS. 1A to 1T are sectional views illustrating steps of forming a semiconductor device according to a first embodiment of the present invention.

First, steps required until a structure illustrated as FIG. 1A is formed will be explained below.

First, an element isolation insulating layer 2, e.g., shallow trench isolation (STI) is formed in a silicon substrate 1 which is a semiconductor substrate. The element isolation insulating layer 2 is formed in regions that separate active regions in a low-voltage transistor forming area A, a high-voltage transistor forming area B, and the like respectively. Also, the width of the element isolation insulating layer 2 at an area between the low-voltage transistor forming area A and the high-voltage transistor forming area B is wider than that of the areas A, B.

The STI is formed by the method of forming a recess in an element isolation region of the silicon substrate 1 and then burying an insulating film, e.g., a silicon oxide film in the recess, for example. In this case, as the element isolation insulating layer 2, a silicon oxide film formed on a surface of the silicon substrate 1 by the LOCOS method may be employed.

Then, first to third P-wells 3, 5, 7 and first to third N-wells 4, 6, 8 are formed in a plurality of active regions, which are surrounded by the element isolation insulating layer 2, of the silicon substrate 1 respectively.

The first P-well 3 and the first N-well 4 are formed in a low-voltage transistor forming area, for example, and also the second P-well 5 and the second N-well 6 are formed in a middle-voltage transistor forming area, for example. The low-voltage transistor forming area and the middle-voltage transistor forming area are arranged in the low-voltage transistor forming area A, for example.

The third P-well 7 and the third N-well 8 are formed in the high-voltage transistor forming area B, for example. Also, a p-type buried channel region 8a of low impurity concentration is formed in a surface layer portion of the third N-well 8.

The width of the third P-well 7 is wider than that of the first and second P-wells 3, 5. Also, the width of the third N-well 8 is wider than that of the first and second N-wells 4, 6.

The first to third P-wells 3, 5, 7 and the p-type buried channel region 8a are formed by implanting a p-type impurity, e.g., a boron ion into the silicon substrate 1. Also, the first to third N-wells 4, 6, 8 are formed by implanting an n-type impurity, e.g., an arsenic ion or a phosphorus ion into the silicon substrate 1.

The third P-well 7 and the third N-well 8 are formed deeper than the first and second P-wells 3, 5 and the first and second N-wells 4, 6 respectively.

In this case, areas except the P-well forming areas are covered with a photoresist at a time of p-type impurity ion implantation. Also, areas except the N-well forming areas are covered with a photoresist at a time of n-type impurity ion implantation.

Then, a first gate insulating film 10 is formed on respective surfaces of the first P-well 3 and the first N-well 4. Also, a second gate insulating film 11 is formed on respective surfaces of the second P-well 5 and the second N-well 6. Also, a third gate insulating film 12 is formed on respective surfaces of the third P-well 7 and the p-type buried channel region 8a on the third N-well 8.

The third gate insulating film 12 is formed thicker than the second gate insulating film 11, and the second gate insulating film 11 is formed thicker than the first gate insulating film 10. The first to third gate insulating films 10, 11, 12 are formed by the thermally oxidizing method for example. Respective thicknesses of the first to third gate insulating films 10, 11, 12 are controlled by using an oxidation preventing film such as a silicon nitride film, or the like.

A thickness of the first gate insulating film 10 is 4 nm when a 1.8 V transistor is formed in the first P-well 3 and the first N-well 4 respectively, for example.

A thickness of the second gate insulating film 11 is 8 nm when a 3.3 V transistor is formed in the second P-well 5 and the second N-well 6 respectively, and is 13 nm when a 5.0 V transistor is formed, for example.

A thickness of the third gate insulating film 12 is 45 nm when a 18 V transistor is formed in the third P-well 7 and the third N-well 8 respectively, is 60 nm when a 25 V transistor is formed, and is 75 nm when a 32 V transistor is formed, for example.

Then, a polysilicon film 13 as a semiconductor film of 100 nm to 200 nm, e.g., 180 nm thick is formed over the silicon substrate 1 by the chemical vapor deposition (CVD) method. The polysilicon film 13 may be formed by a method of forming an amorphous silicon film over the silicon substrate 1 and then applying a heat treatment to the amorphous silicon film.

Then, a photoresist is coated on the polysilicon film 13, and then exposed/developed, and thus a resist pattern 14 is formed. As illustrated in FIG. 1B, the resist pattern 14 is formed such that upper areas of the first and second P-wells 3, 5 of the polysilicon film 13 are covered and upper areas of the first to third P-wells 3, 5, 7 and the third N-well 8 of the polysilicon film 13 are exposed.

Then, phosphorus is ion-implanted into the polysilicon film 13 as an N-type impurity, using the resist pattern 14 as a mask. As the conditions of the ion implantation in this case, an acceleration energy is set to 20 keV, a dopant concentration is set to $4.2 \times 10^{15}$ cm$^{-2}$, and an ion implantation angle is set to 7 degrees to a line perpendicular to a surface of the polysilicon film 13.

Thus, the polysilicon film 13 has an electrically low resistance in areas over the first to third P-wells 3, 5, 7 and the third N-well 8, and acts as a conductive film.

Then, the resist pattern 14 is removed.

Figure 1C:
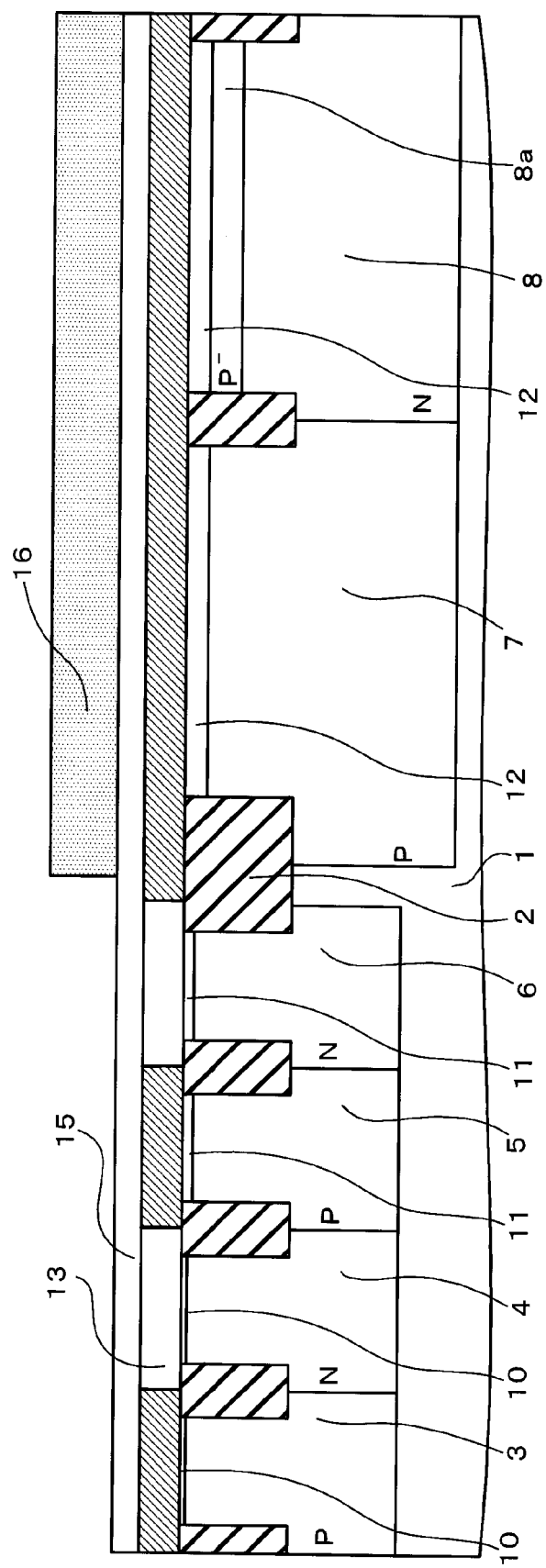

Next, steps required until a structure illustrated as FIG. 1C is formed will be explained bellow.

First, a silicon oxide film is formed on the polysilicon film 13 as a first insulating film 15 by the CVD method. The first insulating film 15 is formed thicker than the third gate insulating film 12 to have a thickness of 100 nm to 200 nm, e.g., 150 nm, for example.

Then, a photoresist is coated on the first insulating film 15 and then exposed/developed, and thus a resist pattern 16 is formed. The resist pattern 16 covers the first insulating film 15 located over the high-voltage transistor forming area B including the third P-well 7 and the third N-well 8. Also, the resist pattern 16 exposes the first insulating film 15 located over the low-voltage transistor forming area A including the first and second P-wells 3, 5 and the first and second N-wells 4, 6.

In this case, an edge portion of the resist pattern 16 for covering the high-voltage transistor forming area B is positioned on the element isolation insulating layer 2.

Then, as illustrated in FIG. 1D, the first insulating film 15 is etched, using the resist pattern 16 as a mask. Thus, the polysilicon film 13 in the low-voltage transistor forming area A is exposed.

The etching conditions of the silicon oxide film as the first insulating film 15 are not particularly limited. However, for following reasons, it is preferable that the dry etching method and the wet etching method may be used in combination.

When the first insulating film 15 is removed from the low-voltage transistor forming area A by the dry etching method, e.g., the reactive ion etching method only, the polysilicon film 13 suffers the charge damage. Therefore, it is feared that the characteristic of the transistor including the polysilicon film 13 fluctuates. In contrast, when a portion of the first insulating film 15 in the low-voltage transistor forming area A is removed by the wet etching method only, a chemical solution seeps into the end portion of the first insulating film 15 left in the high-voltage transistor forming area B. As a result, the end portion of the first insulating film 15 is thinned after the etching, and a difference in film thickness between a center portion and the end portion is increased.

Therefore, as the etching method of the first insulating film 15 in the low-voltage transistor forming area A, the dry etching method is employed as the first step and then the wet etching method is employed as the second step. For example, the first insulating film 15 is removed to 80% in thickness by the dry etching method, and then the remaining first insulating film 15 is removed by the wet etching method. Then, the first insulating film 15 is overetched in the time more than the wet etching time.

Thus, the first insulating film 15 is removed from the low-voltage transistor forming area A without residue, and also a variation in a thickness distribution of the first insulating film 15 is lessened after etching.

Figure 2:
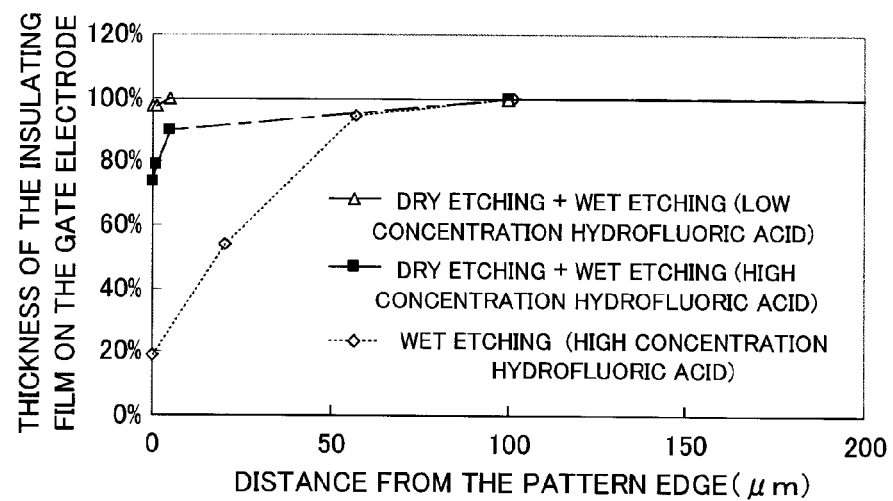
FIG. 2 is the thickness distribution of insulating films depending on differences of etching conditions in patterning the insulating film formed on the gate electrode, for manufacturing the semiconductor device according to the first embodiment of the present invention.

FIG. 2 illustrates the results which are obtained by wet etching only the first insulating film 15 and by dry etching and wet etching in combination the first insulating film 15. A silicon oxide film was formed as the first insulating film 15, and hydrofluoric acid solution was used in the wet etching.

When the first insulating film 15 was patterned by wet etching using only hydrofluoric acid whose concentration was 1.0 wt %, the end portion of the first insulating film 15 was reduced in thickness by 80% of the beginning.

In contrast, the first insulating film 15 was etched to a thickness of 80% by the dry etching method and then a remaining thickness of 20% was removed by wet etching. Thus, a variation in the film thickness distribution is reduced significantly rather than the case where only the wet etching was applied.

In FIG. 2A, according to the film thickness distributions after etching by using hydrofluoric acid whose concentration of 1.0 wt % and using hydrofluoric acid whose concentration was 0.25 wt %, the film thickness difference was smaller when hydrofluoric acid of low concentration was used.

As a reaction gas of the dry etching method, for example, a mixed gas including of $CHF_3$, $CF_4$, and argon (Ar) was used.

After the above patterning of the first insulating film 15, the resist pattern 16 is removed.

Next, steps required until a structure illustrated as FIG. 1E is formed will be explained bellow.

First, a photoresist is coated on the first insulating film 15 and the polysilicon film 13, and then exposed/etched. Thus, a resist pattern 17 is used to form the low voltage and high voltage gate electrodes.

The resist pattern 17 has a planar shape of the gate electrodes on the first and second P-wells 3, 5 and the first and second N-wells 4, 6 in the low-voltage transistor forming area A respectively. Also, the resist pattern 17 has a shape to cover the high-voltage transistor forming area B. In this case, a part of the first insulating film 15 on the element isolation insulating layer 2 may be exposed from the resist pattern 17 at the peripheral portion of the high-voltage transistor forming area B.

Then, the polysilicon film 13 is etched, using the resist pattern 17 as a mask.

The polysilicon film 13 in the low-voltage transistor forming area A is patterned by this etching. Thus, first to fourth gate electrodes 13a, 13b, 13c, 13d are formed of the polysilicon film 13. The first and second gate electrodes 13a, 13b are semiconductor patterns, and are formed on the first P-well 3 and the first N-well 4 through the first gate insulating film 10 respectively. Also, the third and fourth gate electrodes 13c, 13d are formed on the second P-well 5 and the second N-well 6 through the second gate insulating film 11 respectively.

The condition for etching the polysilicon film 13 may be set to not remove the first gate insulating film 10 which is thinnest than the other gate insulating films, for example. As the etching gas, for example, HBr, $O_2$, and $Cl_2$ are used. Accordingly, it can be suppressed that the element isolation insulating layer 2 are thinned. Then, the resist pattern 17 is removed.

Figure 1F:
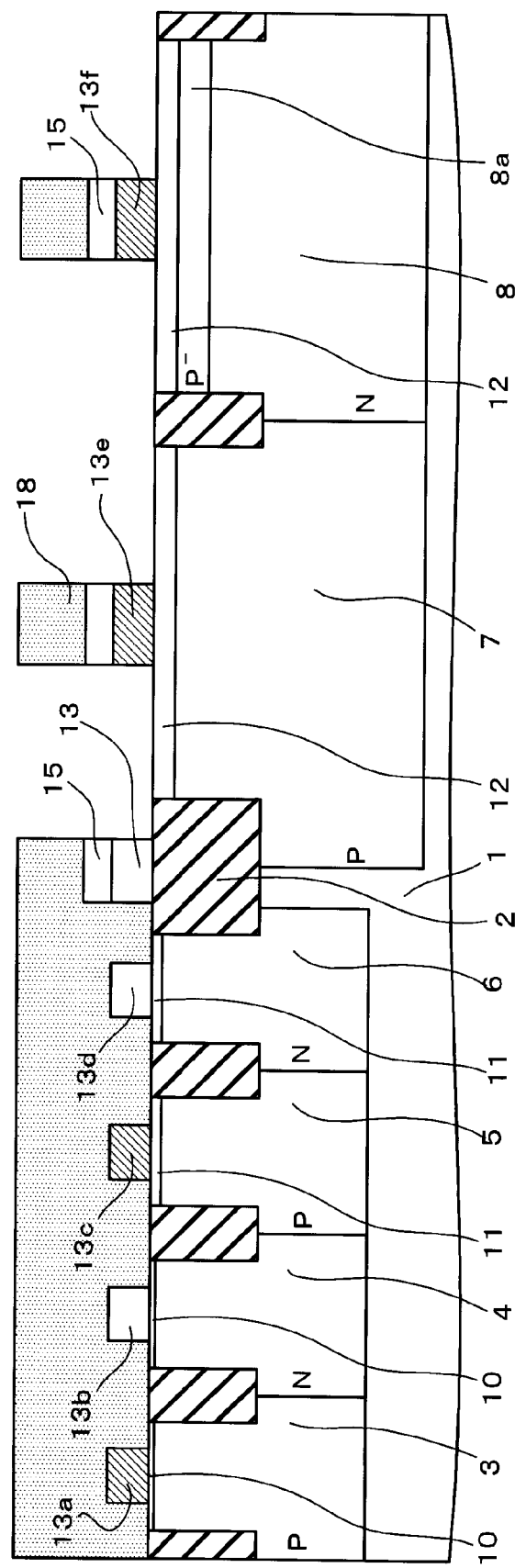

Next, steps required until a structure illustrated as FIG. 1F is formed will be explained below.

First, a photoresist is coated over the silicon substrate 1 and then exposed/developed, and thus a resist pattern 18 is formed. The resist pattern 18 has high-voltage gate electrode forming patterns on the third P-well 7 and the third N-well 8, and also has a shape to cover the low-voltage transistor forming area A. In this case, the resist pattern 18 has a shape to cover the first insulating film 15 left on the element isolation insulating layer 2 located around the high-voltage transistor forming area B.

Then, the first insulating film 15 and the polysilicon film 13 are etched, using the resist pattern 18 as a mask. Thus, the polysilicon film 13 is patterned such that fifth and sixth gate electrodes 13e, 13f are formed as semiconductor patterns on the third P-well 7 and the third N-well 8 respectively. Respective widths, i.e., gate lengths, of the fifth and sixth gate electrodes 13e, 13f are formed longer than gate lengths of the first to fourth gate electrodes 13a to 13d.

Respective etching conditions of the first insulating film 15 and the polysilicon film 13 may be set identically to the above conditions. When the polysilicon film 13 is etched on a selected condition used as an etching rate lower than a polysilicon film 13, it can suppress that the third gate insulating film 12 is removed and also the element isolation insulating layer 2 exposed in the high-voltage transistor forming area B become thin.

Then, the resist pattern 18 is removed. In this case, the polysilicon film 13 and the first insulating film 15 may be partly left on the element isolation insulating layer 2 in the peripheral portion of the high-voltage transistor forming area B.

Respective distances between the fifth and sixth gate electrodes 13e, 13f and the element isolation insulating layer 2 are set longer than distances between the first to fourth gate electrodes 13a to 13d and the element isolation insulating layer 2 in the gate length direction respectively.

Figure 1G:
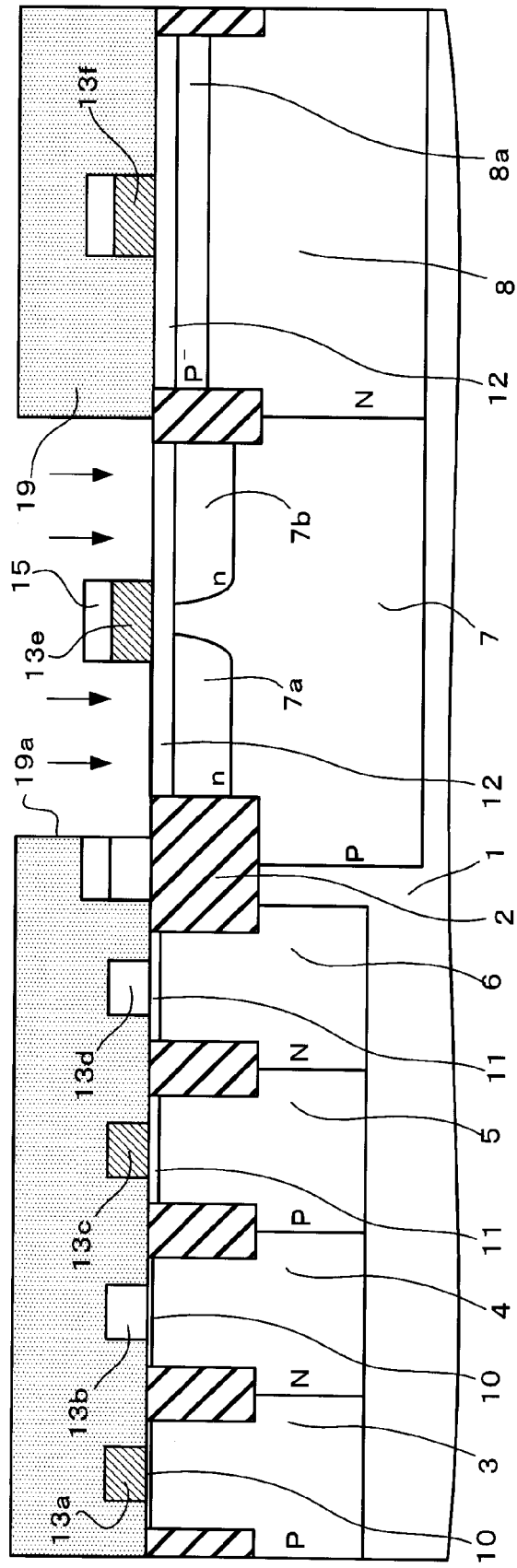

Next, steps required until a structure illustrated as FIG. 1G is formed will be explained below.

First, a photoresist is coated newly over the silicon substrate 1 and then exposed/developed, and thus a resist pattern 19 is formed. The resist pattern 19 has an opening 19a to expose the upper of the third P-well 7, and has a shape to cover the low-voltage transistor forming area A and the third N-well 8.

Then, a phosphorus ion is implanted into the third P-well 7 through the opening 19a, using the resist pattern 19 as a mask. In this case, the fifth gate electrode 13e and the first insulating film 15 formed thereon act as a mask. Therefore, two first n-type offset regions 7a, 7b that are separated under the fifth gate electrode 13e are formed in the third P-well 7 by the ion implantation. In applying the ion implantation, following conditions are employed, for example. Here, an ion implantation angle is an angle to a line that is perpendicular to the surface of the silicon substrate 1.

As the ion implantation conditions to form a 18 V NMOS transistor in the third P-well 7, an accelerating is set to 120 keV, and a dosage is set to $3.0\times10^{12}$ cm$^{-2}$, and an ion implantation angle is set to 45 degrees. Also, the ion is implanted from four directions at a time of ion implantation.

As the ion implantation conditions to form a 25 V NMOS transistor, an accelerating is set to 160 keV, and a dosage is set to $2.8\times10^{12}$ cm$^{-2}$, and an ion implantation angle is set to 45 degrees. Also, the ion is implanted from four directions at a time of ion implantation.

As the ion implantation conditions to form a 32 V NMOS transistor, an accelerating is set to 160 keV, and a dosage is set to $3.0\times10^{12}$ cm$^{-2}$, and an ion implantation angle is set to 45 degrees. Also, the ion is implanted from four directions at a time of ion implantation.

At a time of impurity ion implantation, the first insulating film 15 and the fifth gate electrode 13e can prevent the penetration of the ion into the third P-well 7 underlying them. The impurity which penetrates the first insulating film 15 is injected into the fifth gate electrode 13e.

Then, the resist pattern 19 is removed.

Figure 1H:
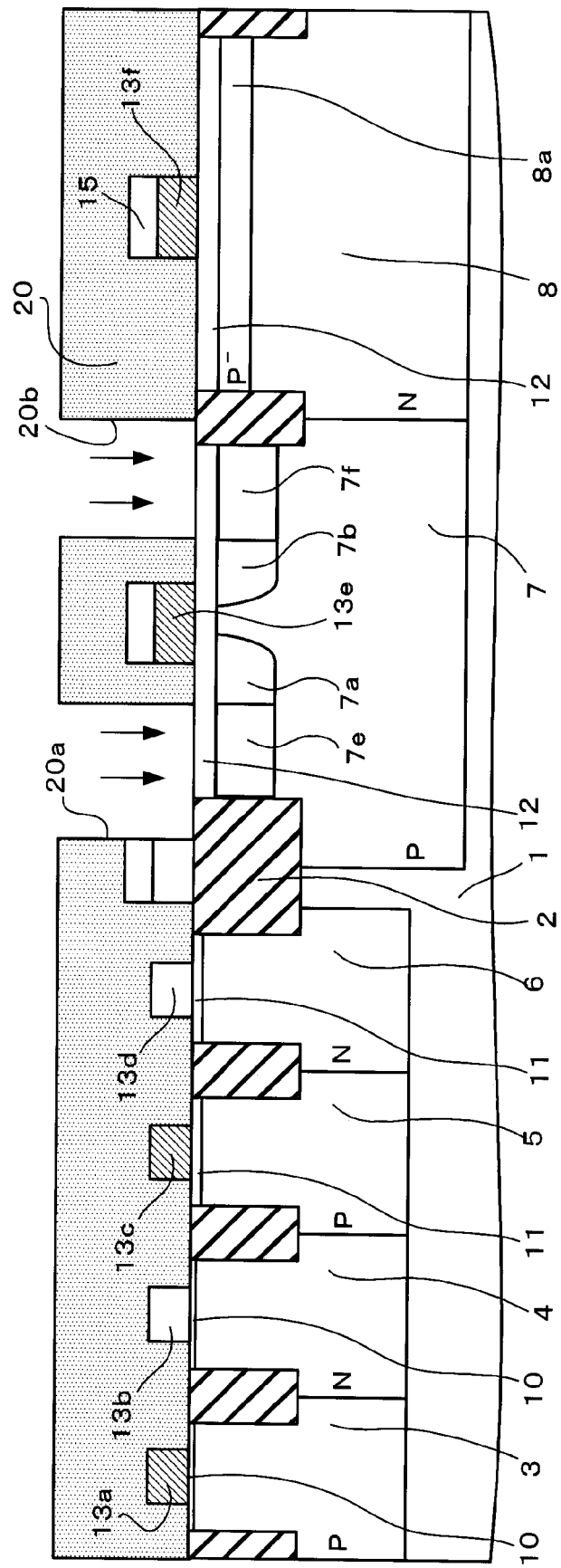

Next, steps required until a structure illustrated as FIG. 1H is formed will be explained below.

First, a photoresist is coated over the silicon substrate 1 and then exposed/developed, and thus a resist pattern 20 is formed. The resist pattern 20 covers the fifth gate electrode 13e and its neighborhood over the third P-well 7, and has openings 20a, 20b on each part of the first n-type offset regions 7a, 7b on both side directions of the gate electrode 13e. Also, the resist pattern 20 has a shape to cover the low-voltage transistor forming area A and the third N-well 8.

Then, a phosphorus ion is implanted into the third P-well 7 through the openings 20a, 20b, using the resist pattern 20 as a mask. Thus, second n-type offset regions 7e, 7f of high impurity concentration are formed in parts of the first n-type offset regions 7a, 7b respectively. As the phosphorus ion implantation conditions in this case are employed as follows, for example.

As the ion implantation conditions to form the 18 V NMOS transistor in the third P-well 7, an acceleration, a dosage, and an ion implantation angle are set to 120 keV, $4.0\times10^{12}$ cm$^{-2}$, and 60 degrees respectively. Also, the ion is implanted from four directions at a time of ion implantation.

As the ion implantation conditions to form the 25 V NMOS transistor, an acceleration, a dosage, and an ion implantation angle are set to 160 keV, $3.0\times10^{12}$ cm$^{-2}$, and 45 degrees respectively. Also, the ion is implanted from four directions at a time of ion implantation.

As the ion implantation conditions to form the 32 V NMOS transistor, an acceleration, a dosage, and an ion implantation angle are set to 160 keV, $3.0\times10^{12}$ cm$^{-2}$, and 45 degrees respectively. Also, the ion is implanted from four directions at a time of ion implantation.

Then, the resist pattern 20 is removed.

Figure 1I:
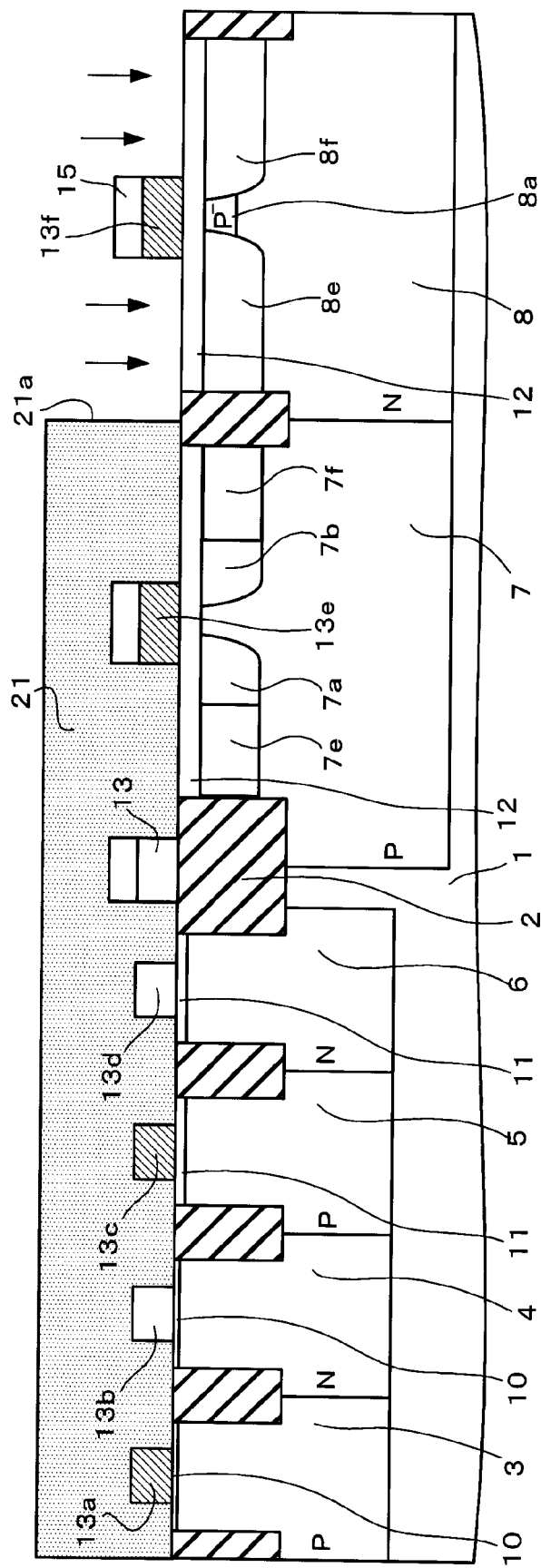

Next, steps required until a structure illustrated as FIG. 1I is formed will be explained bellow.

First, a photoresist is coated over the silicon substrate 1 and then exposed/developed, and thus a resist pattern 21 is formed. The resist pattern 21 has an opening 21a over the third N-well 8, and has a shape to cover the low-voltage transistor forming area A and the third P-well 7.

Then, a boron ion is implanted into the third N-well 8 through the opening 21a, using the resist pattern 21 as a mask. Thus, p-type offset regions 8e, 8f are formed on both sides of the sixth gate electrode 13f. As the boron ion implantation conditions in this case are employed as follows, for example.

As the ion implantation conditions to form the 18 V PMOS transistor in the third N-well 8, an acceleration and a dosage are set to 30 keV, $3.0\times10^{12}$ cm$^{-2}$ respectively. Also, as the ion implantation conditions to form the 25 V PMOS transistor, an acceleration and a dosage are set to 40 keV and $3.5\times10^{12}$ cm$^{-2}$ respectively. Also, as the ion implantation conditions to form the 32 V PMOS transistor, an acceleration and a dosage are set to 50 keV and $3.0\times10^{12}$ cm$^{-2}$ respectively. In this case, at a time of the boron ion implantation, the ion is implanted from the direction perpendicular to the upper surface of the silicon substrate 1.

At a time of ion implantation, the first insulating film 15 and the sixth gate electrode 13f can prevent the penetration of the ion into the third P-well 7 underlying them. The impurity that pierced the first insulating film 15 is injected into the sixth gate electrode 13f.

Then, the resist pattern 21 is removed.

Figure 1J:
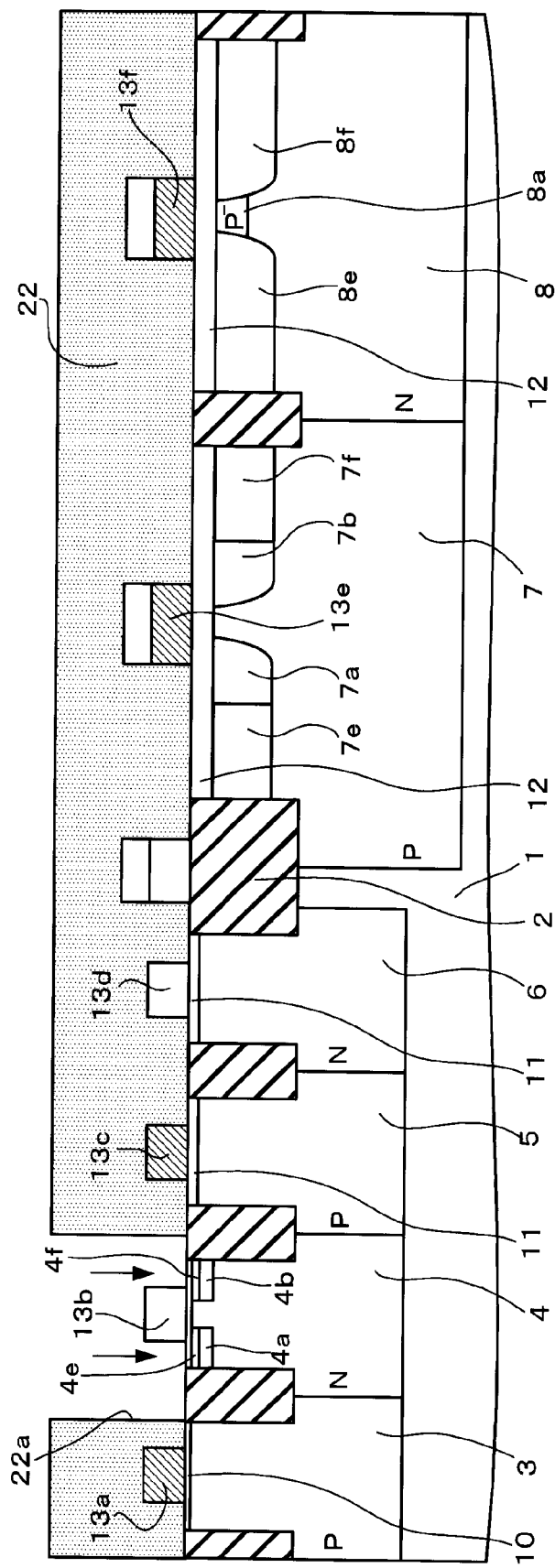

Next, steps required until a structure illustrated as FIG. 1J is formed will be explained below.

First, a photoresist is coated over the silicon substrate 1 and then exposed/developed, and thus a resist pattern 22 is formed. The resist pattern 22 has an opening 22a over the first N-well 4, and has a shape to cover other areas of the low-voltage transistor forming area A and the high-voltage transistor forming area B.

Then, a phosphorus ion is implanted into the first N-well 4 through the opening 22a, using the resist pattern 22 as a mask, and thus n-type impurity high-concentration regions 4a, 4b are formed in the first N-well 4 on both sides of the second gate electrode 13b. Then, a boron fluoride ion (BF$_2^+$) is implanted into the first N-well 4 to a depth that is shallower than the n-type impurity high-concentration regions 4a, 4b. Thus, p-type extension regions 4e, 4f are formed on both sides of the second gate electrode 13b.

When the 1.8 V PMOS transistor is formed in the first N-well 4, the conditions of the ion implantation are set as follows, for example.

The Holo ion implantation applied to form the n-type impurity high-concentration regions 4a, 4b is executed under the conditions of an acceleration of the phosphorus ion of 20 keV and a dosage of $6.0\times10^{13}$ cm$^{-2}$.

Also, the ion implantation applied to form the p-type extension regions 4e, 4f is executed under the conditions of an acceleration of the boron fluoride ion of 5 keV and a dosage of $3.0\times10^{14}$ cm$^{-2}$.

In this case, at these ion implantations, the ion is implanted from the direction perpendicular to the upper surface of the silicon substrate 1 respectively.

Then, the resist pattern 22 is removed.

Figure 1K:
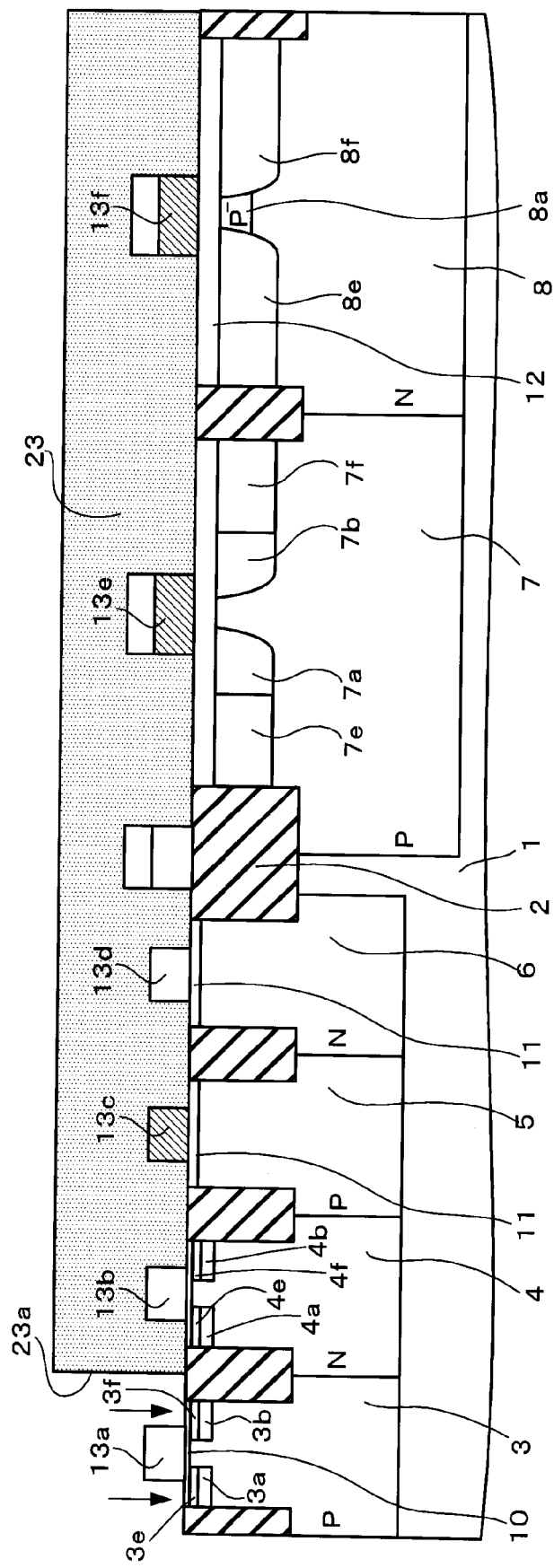

Next, steps required until a structure illustrated as FIG. 1K is formed will be explained below.

First, a photoresist is coated newly over the silicon substrate 1 and then exposed/developed, and thus a resist pattern 23 is formed. The resist pattern 23 has an opening 23a over the first P-well 3, and has a shape to cover other areas of the low-voltage transistor forming area A and the high-voltage transistor forming area B.

Then, a boron ion is implanted through the opening 23a, using the resist pattern 23 as a mask, and thus p-type impurity high-concentration regions 3a, 3b are formed in the first P-well 3 on both sides of the first gate electrode 13a. Then, an arsenic ion is implanted into the first P-well 3 to a depth that is shallower than the p-type impurity high-concentration regions 3a, 3b. Thus, n-type extension regions 3e, 3f are formed on both sides of the first gate electrode 13a.

When the 1.8 V NMOS transistor is formed in the first P-well 3, the conditions of the ion implantation are set as follows, for example.

The Holo ion implantation applied to form the p-type impurity high-concentration regions 3a, 3b is executed under the conditions which include a boron ion acceleration of 15 keV and a dosage of $1.0 \times 10^{13}$ cm$^{-2}$.

Also, the ion implantation applied to form the n-type extension regions 3e, 3f is executed under the conditions which include a arsenic ion acceleration of 10 keV and a dosage of $5.0 \times 10^{14}$ cm$^{-2}$.

In this case, at these ion implantations, the ion is implanted from the direction perpendicular to the upper surface of the silicon substrate 1 respectively.

Then, the resist pattern 23 is removed.

Figure 1L:
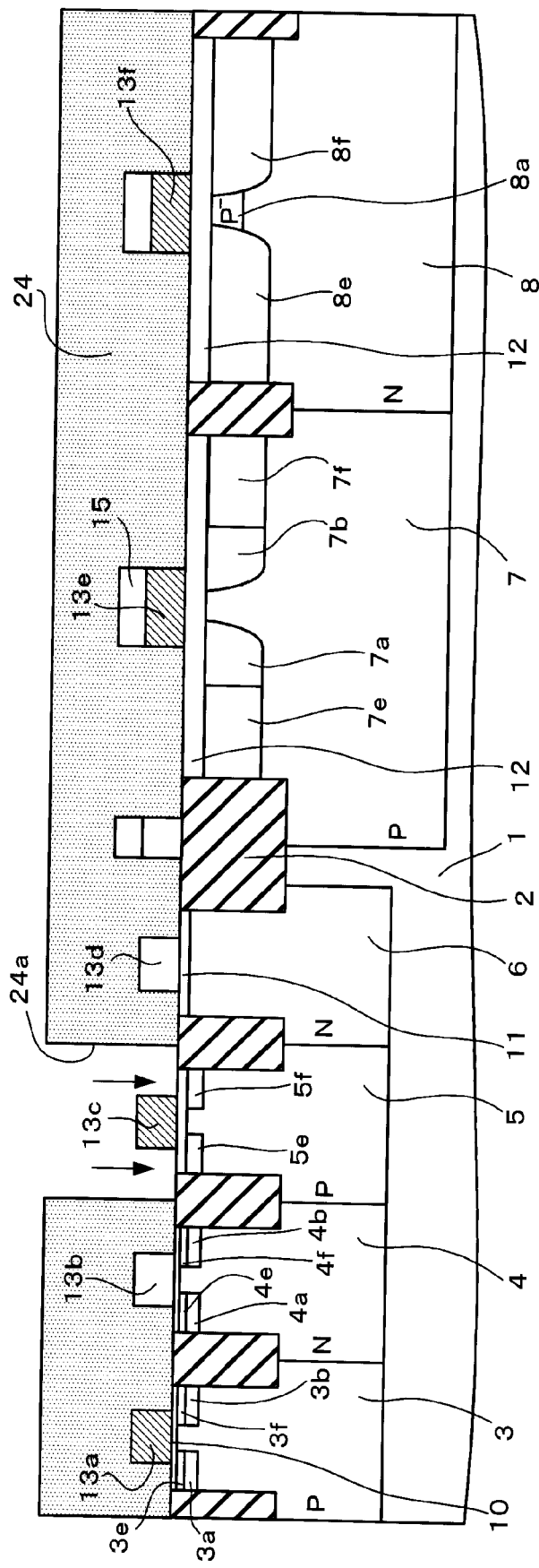

Next, steps required until a structure illustrated as FIG. 1L is formed will be explained bellow.

First, a photoresist is coated newly over the silicon substrate 1 and then exposed/developed, and thus a resist pattern 24 is formed. The resist pattern 24 has an opening 24a over the second P-well 5, and has a shape to cover other areas of the low-voltage transistor forming area A and the high-voltage transistor forming area B.

Then, a phosphorus ion is implanted through the opening 24a, using the resist pattern 24 as a mask. Thus, n-type extension regions 5e, 5f are formed in the second P-well 5 on both sides of the third gate electrode 13c.

When a 5 V NMOS transistor is formed in the second P-well 5, the conditions of the phosphorus ion implantation include an acceleration of 30 keV, and a dosage of $3.0 \times 10^{12}$ cm$^{-2}$, for example. At the time of the phosphorus ion implantation, the ion is implanted from the direction perpendicular to the upper surface of the silicon substrate 1.

Then, the resist pattern 24 is removed.

Figure 1M:
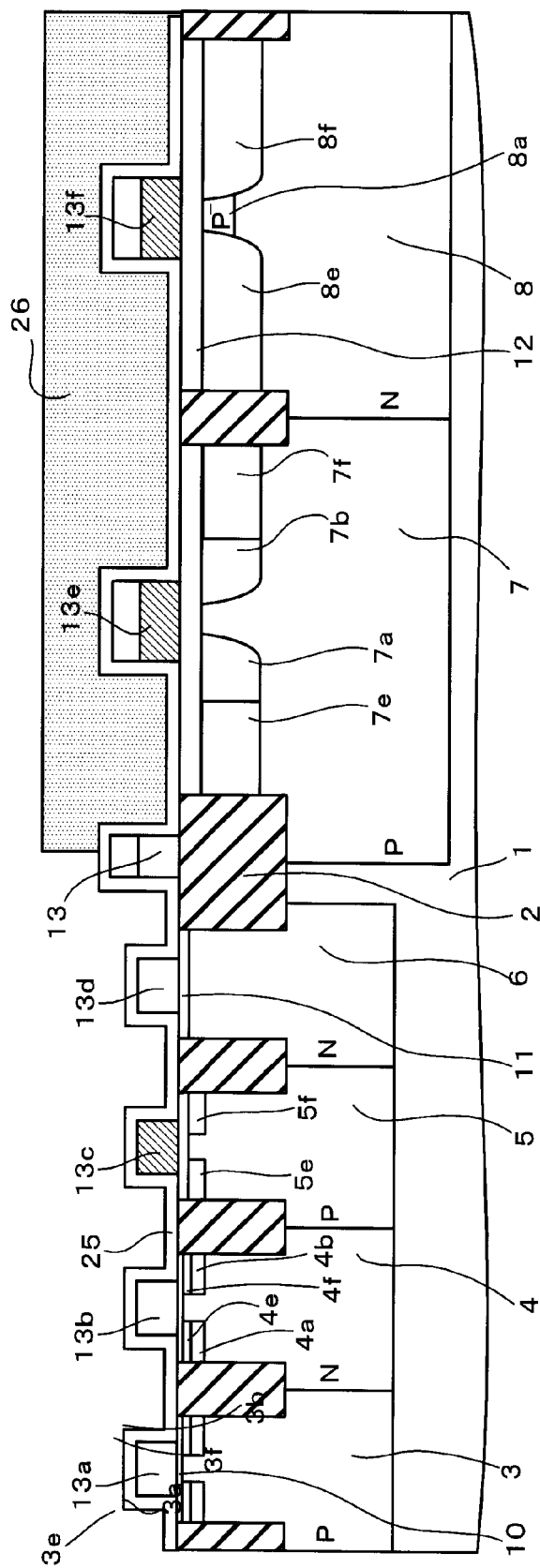

Then, as illustrated in FIG. 1M, a silicon oxide film is formed as a second insulating film 25 on the element isolation insulating layer 2, the first to third gate insulating films 10, 11, 12, and the first to sixth gate electrodes 13a to 13f by the CVD method in a thickness of 50 nm to 150 nm, e.g., 100 nm.

Next, a photoresist is coated on the second insulating film 25 and then exposed/developed, and thus a resist pattern 26 is formed. The resist pattern 26 has a shape to open the low-voltage transistor forming area A and cover the high-voltage transistor forming area B. In this case, a part of the upper portion of the polysilicon film 13 left on the element isolation insulating layer 2 may be covered with the resist pattern 26 at the edge portion of the high-voltage transistor forming area B.

Next, the silicon oxide film, which constitutes the second insulating film 25 and the first and second gate insulating films 10, 11 in the low-voltage transistor forming area A, is etched in a depth of 100 nm in the almost perpendicular direction, using the resist pattern 26 as a mask, and then is etched excessively. In this case, for example, CHF$_3$, CF$_4$, and Ar are used as an etching gas.

Figure 1N:
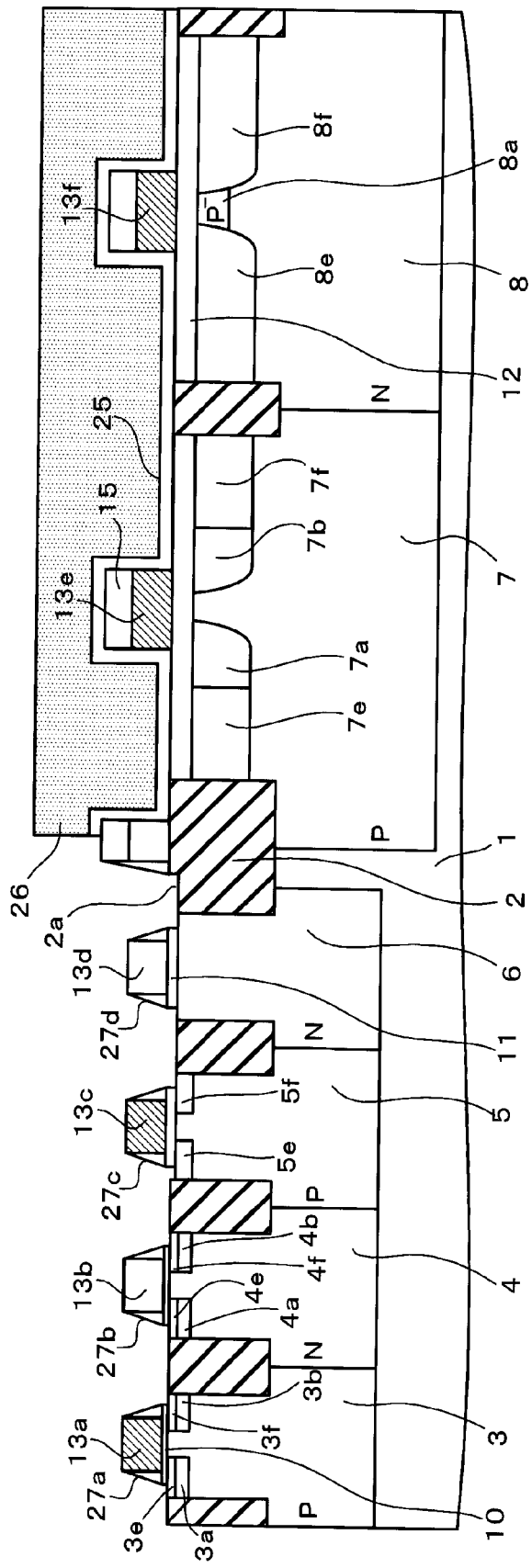
Figure 10:
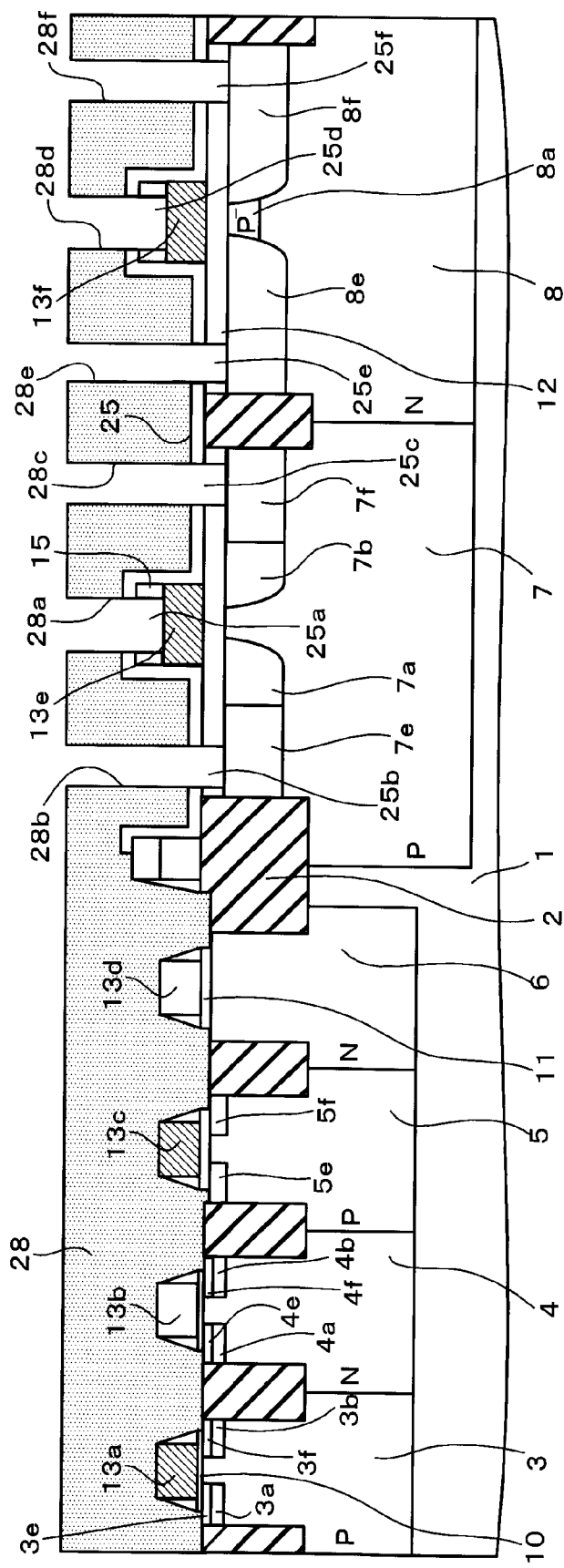

Thus, as illustrated in FIG. 1N, each part of the first and second P-wells 3, 5 and the first and second N-wells 4, 6 are exposed, and the second insulating film 25 is left on side surfaces of the first to fourth gate electrodes 13a to 13d as sidewalls 27a to 27d respectively.

In this case, upper surfaces of the first to fourth gate electrodes 13a to 13d are also exposed. Also, the silicon oxide film constituting the element isolation insulating layer 2 is etched in the periphery of the high-voltage transistor forming area B and the low-voltage transistor forming area A. As a result, a level difference 2a whose depth is substantially equal to a thickness of the second gate insulating film 11 is formed in the periphery of the high-voltage transistor forming area B.

Then, the resist pattern 26 is removed.

Next, steps required until a structure illustrated as FIG. 1O is formed will be explained bellow.

First, a photoresist is coated over the silicon substrate 1 and then exposed/developed, and thus a resist pattern 28 is formed. The resist pattern 28 has first to sixth openings 28a to 28f over the third P-well 7 and the third N-well 8 in the high-voltage transistor forming area B, and has a shape to cover the element isolation insulating layer 2 and the low-voltage transistor forming area A.

The first opening 28a is formed over a center area of the upper surface of the fifth gate electrode 13e. Also, the second and third openings 28b, 28c are formed in areas that are away from the fifth gate electrode 13e and the element isolation insulating layer 2, over each part of the second n-type offset regions 7e, 7f.

Also, the fourth opening 28d is formed over a center area of the upper surface of the sixth gate electrode 13f. Also, the fifth and sixth openings 28e, 28f are formed in areas that are apart from the sixth gate electrode 13f and the element isolation insulating layer 2, over each part of the p-type offset regions 8e, 8f.

Then, the silicon oxide film constituting the first insulating film 15, the second insulating film 25, and the third gate insulating film 12 respectively is dry-etched in the substantially perpendicular direction, using the resist pattern 28 as a mask. In this case, for example, CHF$_3$, CF$_4$, and Ar are used as an etching gas.

Under such conditions, the first insulating film 15 and the second insulating film 25 are etched through the first and fourth openings 28a, 28d up to a depth of 250 nm, and then the overetching is applied. Thus, first and second gate opening portions 25a, 25d are formed so that center areas of upper surfaces of the fifth and sixth gate electrodes 13e, 13f are exposed respectively. At the same time, the third gate insulating film 12 is etched through the second, third, fifth and sixth openings 28b, 28c, 28e, 28f. Thus, source/drain (S/D) contact holes 25b, 25c, 25e, 25f that expose each part of the second n-type offset regions 7e, 7f and the p-type offset regions 8e, 8f respectively are formed.

According to the above relationship between the film thicknesses, level differences of the gate opening portions 25a, 25d from the upper surfaces of the fifth and sixth gate electrodes 13e, 13f are larger than level differences of the S/D contact holes 25b, 25c, 25e, 25f from the substrate surfaces. Also, level differences of the S/D contact holes 25b, 25c, 25e, 25f from the substrate surfaces are larger than a level difference of the edge of the second insulating film 25 on the element isolation insulating layer 2.

When the 18 V transistor is formed in the third P-well 7 and the third N-well 8 respectively, positions of the first and second gate opening portions 25a, 25d and positions of the S/D contact holes 25b, 25c, 25e, 25f are set as follows, for example.

The first gate opening portion 25a is formed in the position that is away from both side edges of the upper surface of the fifth gate electrode 13e by 0.15 μm to 0.25 μm, e.g., 0.2 μm. Also, the S/D contact holes 25b, 25c on both sides of the fifth gate electrode 13e are formed in the positions that are apart from the fifth gate electrode 13e by 1.0 μm to 2.0 μm, e.g., 1.4 μm and are apart from the element isolation insulating layer 2 by about 0.55 μm in the gate length direction respectively.

The second gate opening portion 25d is formed in the position that is apart from both side edges of the upper surface of the sixth gate electrode 13f by about 0.2 μm. Also, the S/D contact holes 25e, 25f on both sides of the sixth gate electrode 13f are formed in the positions that are apart from the sixth gate electrode 13f by 0.3 μm to 1.0 μm, e.g., 0.6 μm and are apart from the element isolation insulating layer 2 by 0.4 μm to 0.7 μm, e.g., 0.55 μm in the gate length direction respectively.

The reason why the S/D contact holes 25b, 25c, 25e, 25f are positioned away from both sides of the gate electrodes 13e, 13f is given as follows.

That is, regions of the second n-type offset regions 7e, 7f and the p-type offset regions 8e, 8f just below the S/D contact holes 25b, 25c, 25e, 25f are formed as a high impurity concentration region by the later steps respectively, and then a silicide is formed thereon. Therefore, if the S/D contact holes 25b, 25c, 25e, 25f are located too close to the gate electrodes 13e, 13f, a junction breakdown voltage decrease in the high-voltage transistor forming area B.

Also, the reason why the gate opening portions 25a, 25d are not formed on the whole upper surfaces of the gate electrodes 13e, 13f respectively is that such a situation may be prevented that the offset regions 7e, 7f, 8e, 8f located in vicinity of the gate electrodes are exposed due to displacement of the gate opening portions 25a, 25d.

In contrast, the reasons why the gate electrodes 13e, 13f and the S/D contact holes 25b, 25c, 25e, 25f are not separated by the sidewalls in the high-voltage transistor forming area B, unlike the low-voltage transistor forming area A, are given as follows.

Figure 3:
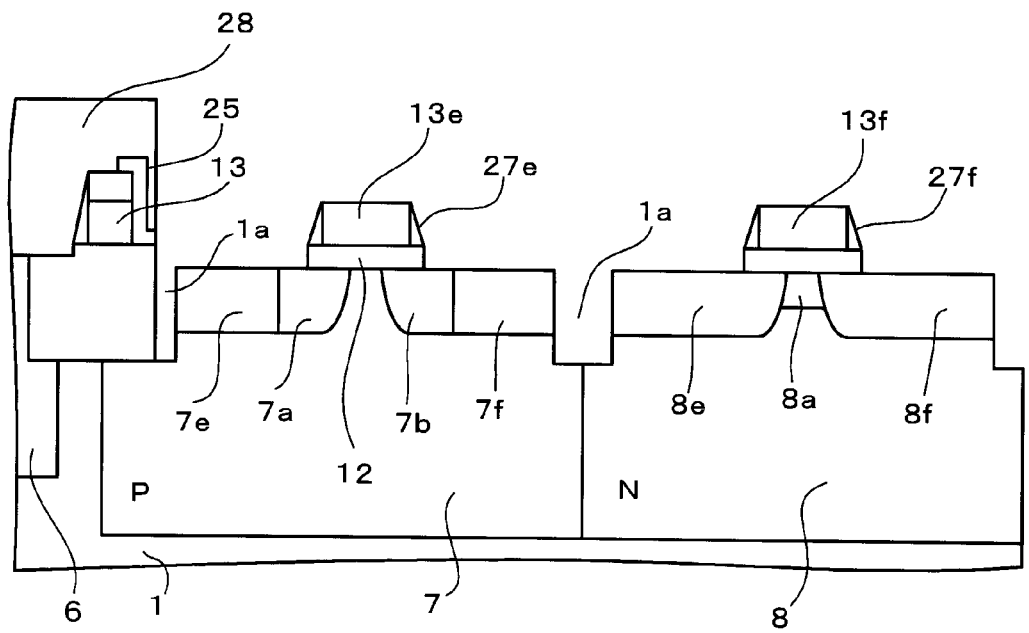
FIG. 3 is a sectional view illustrating a step of forming sidewalls on side surfaces of gate electrodes in a high-voltage transistor forming region, for manufacturing the semiconductor device according to the first embodiment of the present invention.

For example, as illustrated in FIG. 3, sidewalls 27e, 27f are formed on side surfaces of the gate electrodes 13e, 13f by etching the first and second insulating film 15 and 25, in the high-voltage transistor forming area B. In this case, the first and second insulating film 15, 25 are etched until the upper surfaces of the gate electrodes 13e, 13f are exposed.

Thus, an etching time required for forming the sidewall formation is extended, and the element isolation insulating layer 2 are excessively etched. Thus, it is feared that a recess 1a having a depth to expose bottom portions of the offset regions 7e, 7f, 8e, 8f is formed in the element isolation region 2.

Also, for example, when a conductive material such as the contact plug, or the like, described later, is formed into the recess 1a, it is feared that the second n-type offset regions 7e, 7f and the p-type offset regions 8e, 8f are connected mutually. Also, it is feared that the second n-type offset regions 7e, 7f and the third P-well 7 are short-circuited mutually.

As a consequence, the sidewall is not formed in the high-voltage transistor forming area B.

After the gate opening portions 25a, 25d and the S/D contact holes 25b, 25c, 25e, 25f are formed as described above, the resist pattern 28 is removed.

Figure 1P:
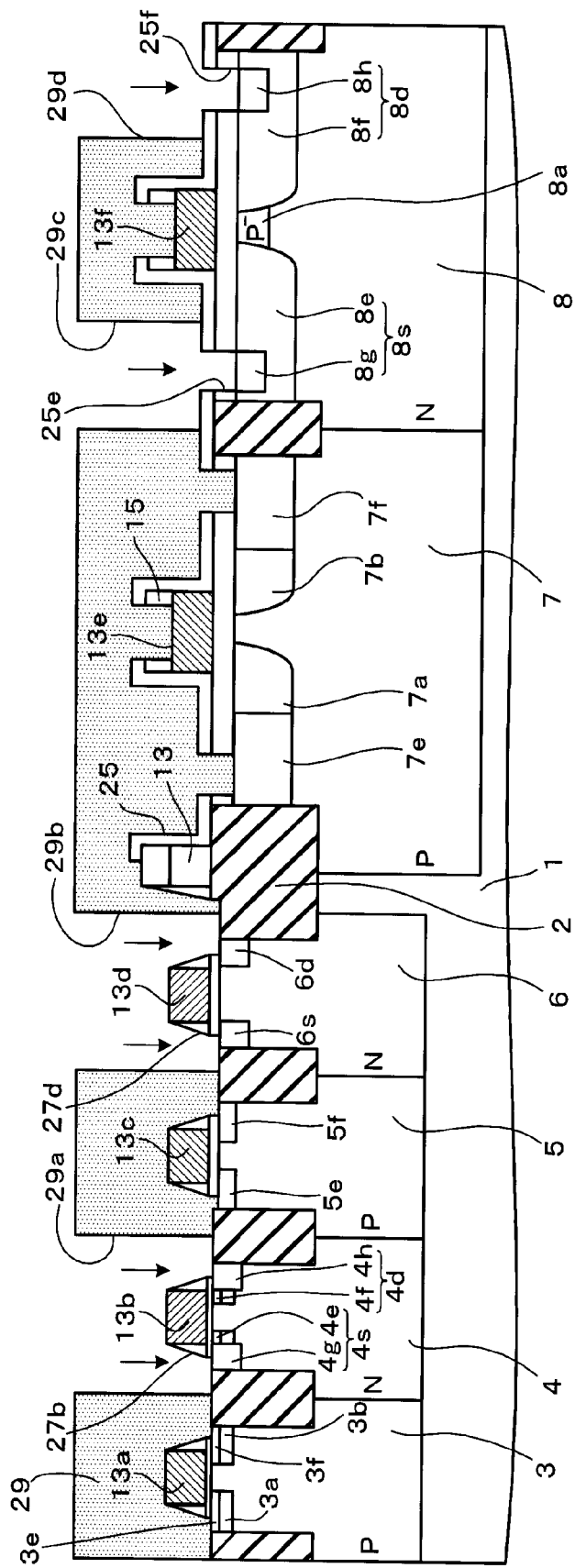

Then, a photoresist is coated over the silicon substrate 1, and then exposed/developed. Thus, as illustrated in FIG. 1P, a resist pattern 29 is formed.

The resist pattern 29 has openings 29a, 29b for exposing the first and second N-wells 4, 6 individually, and has openings 29c, 29d for exposing the S/D contact holes 25e, 25f in the third N-well 8. In this case, the first, second, and third P-wells 3, 5, 7 and the sixth gate electrode 13f are covered with the resist pattern 29.

Then, a boron ion is implanted into the first and second N-wells 4, 6 and the p-type offset regions 8e, 8f in the third N-well 8 through the openings 29a, 29b, 29c, 29d and the S/D contact holes 25e, 25f, using the resist pattern 29 as a mask. In this case, the second and fourth gate electrodes 13b, 13d and the sidewalls 27b, 27d formed on their side surfaces function as a mask respectively.

As the ion implantation conditions, for example, an acceleration of the boron ion is set to 5 keV, and a dosage is set to $2.0 \times 10^{15}$ cm$^{-2}$. At a time of ion implantation, the ion is implanted from the direction perpendicular to the upper surface of the silicon substrate 1.

Accordingly, p-type impurity high-concentration regions 4g, 4h are formed in the first N-well 4 in both side directions of the second gate electrode 13b. The p-type impurity high-concentration regions 4g, 4h and the p-type extension regions 4e, 4f, which are connected mutually, constitute p-type source/drain regions 4s, 4d.

Also, in the second N-well 6, p-type impurity high-concentration regions, namely p-type source/drain regions 6s, 6d, are formed on both sides of the fourth gate electrode 13d.

Further, p-type impurity high-concentration regions 8g, 8h are formed on both sides of the sixth gate electrode 13f in the p-type offset regions 8e, 8f. The p-type impurity high-concentration regions 8g, 8h and the p-type offset regions 8e, 8f constitute p-type source/drain regions 8s, 8d.

Then, the resist pattern 29 is removed. Then, a photoresist is coated newly over the silicon substrate 1 and then exposed/developed. Thus, as illustrated in FIG. 1Q, a resist pattern 30 is formed.

The resist pattern 30 has openings 30a, 30b to expose the first and second P-wells 3, 5 individually, and has openings 30c, 30d to expose the contact holes 25b, 25c in the third P-well 7. In this case, the first, second, and third N-wells 4, 6, 8 and the fifth gate electrode 13e are covered with the resist pattern 30.

In turn, a phosphorus ion is implanted into the first and second P-wells 3, 5 and the second n-type offset regions 7e, 7f in the third P-well 7 through the openings 30a, 30b, 30c, 30d and the S/D contact holes 25b, 25c, using the resist pattern 30 as a mask. In this case, the first and third gate electrodes 13a, 13c and the sidewalls 27a, 27c act as a mask.

As the ion implantation conditions, for example, an acceleration of the phosphorus ion is set to 13 keV, and a dosage is set to $2.0 \times 10^{15}$ cm$^{-2}$. At a time of ion implantation, the ion is implanted from four directions. Also, an ion implantation angle is set at 7 degrees to a line perpendicular to the surface of the silicon substrate 1.

As a result, n-type impurity high-concentration regions 3g, 3h are formed on both sides of the first gate electrode 13a in the first P-well 3. The n-type impurity high-concentration regions 3g, 3h and the n-type extension regions 3e, 3f constitute n-type source/drain regions 3s, 3d.

Also, n-type impurity high-concentration regions 5g, 5h are formed on both sides of the third gate electrode 13c in the second P-well 5. The n-type impurity high-concentration regions 5g, 5h and the n-type extension regions 5e, 5f constitute n-type source/drain regions 5s, 5d.

Also, n-type impurity high-concentration regions 7g, 7h are formed on both sides of the fifth gate electrode 13e in the second n-type offset regions 7e, 7f. The n-type impurity high-concentration regions 7g, 7h and the first and second n-type offset regions 7a, 7b, 7e, 7f constitute n-type source/drain regions 7s, 7d respectively.

Then, the resist pattern 30 is removed. Then, a cobalt film and a titanium film are formed as a metal film 31 over the silicon substrate 1 by the sputter method.

In turn, the polysilicon film 13 constituting the first to sixth gate electrodes 13a to 13f reacts with the cobalt film cause to form silicide by applying a heat treatment at a temperature of 400° C. to 900° C. At the same time, the silicon constituting the n-type source/drain regions 3s, 3d, 5s, 5d, 7s, 7d and the p-type source/drain regions 4s, 4d, 6s, 6d, 8s, 8d reacts with the cobalt film to form silicide.

Then, the titanium film is removed by a mixed solution consisting of ammonia and hydrogen peroxide solution, and also the cobalt film is removed by using a solution such as hydrofluoric acid, or the like.

In this case, the material of the metal film used to form the silicide layer is not limited to the cobalt. Also, nickel, titanium, and other metals may be employed.

As a consequence, as illustrated in FIG. 1R, silicide layers 31a, 31b, 31c, 31d, 31e, 31f are formed on the upper surfaces of the first to sixth gate electrodes 13a to 13f. Also, silicide layers 31g to 31r are formed on the surfaces of the n-type impurity high-concentration regions 3g, 3h, 5g, 5h, 7g, 7h and the p-type impurity high-concentration regions 4g, 4h, 6s, 6d, 8g, 8h respectively.

Based on the above steps, a first NMOS transistor $T_1$ containing the first gate electrode 13a, the n-type source/drain regions 3s, 3d, and the like is formed in the first P-well 3. Also, a first PMOS transistor $T_2$ containing the second gate electrode 13b, the p-type source/drain regions 4s, 4d, and the like is formed in the first N-well 4.

Also, a second NMOS transistor $T_3$ containing the third gate electrode 13c, the n-type source/drain regions 5s, 5d, and the like is formed in the second P-well 5. Also, a second PMOS transistor $T_4$ containing the fourth gate electrode 13d, the p-type source/drain regions 6s, 6d, and the like is formed in the second N-well 6.

Also, a third NMOS transistor $T_5$ containing the fifth gate electrode 13e, the n-type source/drain regions 7s, 7d, and the like is formed in the third P-well 7. Also, a third PMOS transistor $T_6$ containing the sixth gate electrode 13f, the p-type source/drain regions 8s, 8d, and the like is formed in the third N-well 8.

The n-type source/drain regions 7s, 7d constituting the third NMOS transistor $T_5$ is formed deeper than the n-type source/drain regions 3s, 3d, 5s, 5d constituting the first and second NMOS transistors $T_1$, $T_3$. Also, the p-type source/drain regions 8s, 8d constituting the third PMOS transistor $T_6$ is formed deeper than the p-type source/drain regions 4s, 4d, 6s, 6d constituting the first and second PMOS transistors $T_2$, $T_4$.

Figure 1S:
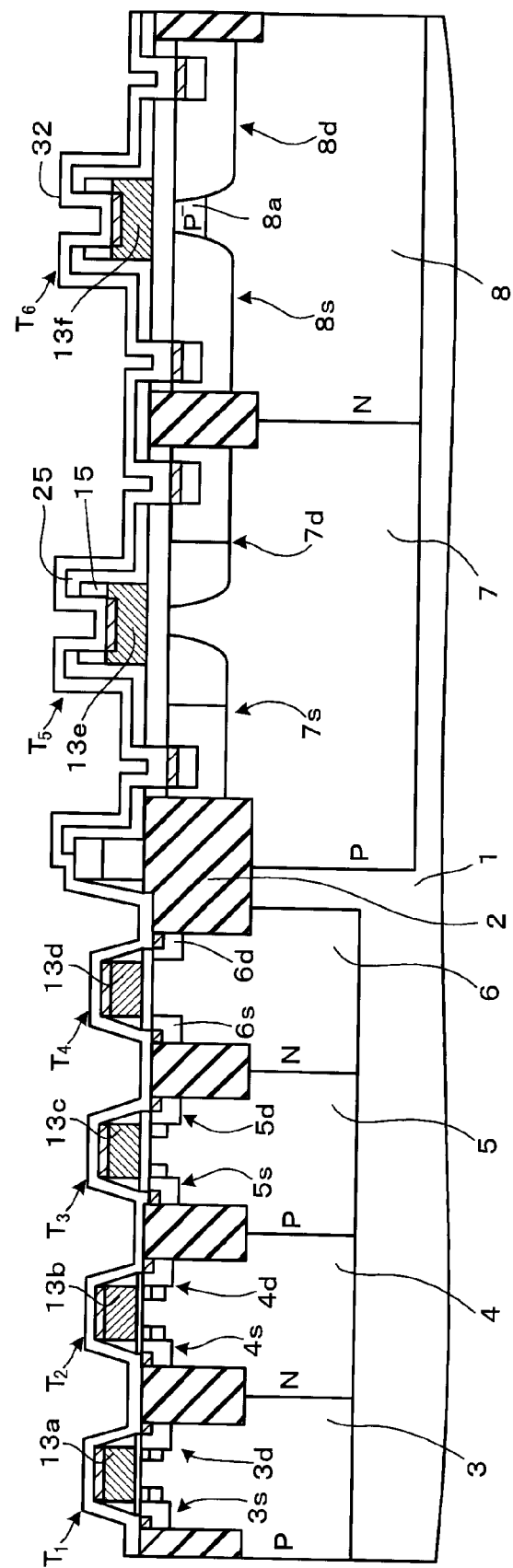

Then, as illustrated in FIG. 1S, a third insulating film 32 for covering the first to third NMOS transistors $T_1$, $T_3$, $T_5$, the first to third PMOS transistors $T_2$, $T_4$, $T_6$, the second insulating film 25, and the like is formed. The third insulating film 32 is a film for acting as an etching stopper. For example, a silicon nitride film of 70 nm thick is formed by the plasma CVD method.

Next, steps applied after the third insulating film 32 is formed will be explained with reference to FIG. 1T bellow.

A borophosphosilicate glass (BPSG) film of 1600 nm thick is formed on the third insulating film 32 as a first interlayer insulating film 33 by the CVD method, and then the BPSG film is planarized by heating. In this case, a silicon oxide film may be formed as the first interlayer insulating film 33 by the CVD method, for example.

Then, the first interlayer insulating film 33 and the third insulating film 32 are patterned by the photolithography method. Thus, contact holes 33a to 33l are formed on the n-type source/drain regions 3s, 3d, 5s, 5d, 7s, 7d and the p-type source/drain regions 4s, 4d, 6s, 6d, 8s, 8d respectively. In this case, the contact holes are also formed on the first to sixth gate electrodes 13a to 13f or wirings connected to these gate electrodes.

The etching of the first interlayer insulating film 33 to form the contact holes 33a to 33l is executed under conditions that the first interlayer insulating film 33 can be selectively etched with respect to the third insulating film 32 which is an etching stopper.

Therefore, multiple locations of the third insulating film 32 can be etched simultaneously. Thus, even though the contact holes 33a to 33h are partly formed on the element isolation insulating layer 2, an excessive etching of the element isolation insulating layer 2 can be suppressed.

In turn, a titanium film, a titanium nitride film, and a tungsten film are formed in sequence in the contact holes 33a to 33l and on an upper surface of the first interlayer insulating film 33. Then, these films are removed from the upper surface of the first interlayer insulating film 33 by the CMP method, and the upper surface of the first interlayer insulating film 33 is planarized.

Accordingly, the titanium film, the titanium nitride film, and the tungsten film being left in the contact holes 33a to 33l constitute conductive contact plugs 34a to 34l. Also, the conductive contact plug is formed on the first to sixth gate electrodes 13a to 13f respectively.

Subsequently, conductive films of a Ti film, an aluminum film, a titanium film, and a titanium nitride film are formed sequentially on the first interlayer insulating film 33 and the conductive contact plugs 34a to 34l by the sputtering method, for example.

Then, the conductive films are patterned by the photolithography method. Thus, conductive patterns 35 such as conductive pads, wirings, and the like connected to the conductive contact plugs 34a to 34l are formed.

In turn, a second interlayer insulating film 36 for covering the conductive patterns 35 is formed, and then a plurality of via holes are formed on the conductive patterns 35 by patterning the second interlayer insulating film 36. Then, via plugs 37a to 37l are formed in the via holes. Here, as the method of forming the via plugs 37a to 37l, for example, the same forming method as that applied to conductive contact plugs 43a to 43l is employed.

Then, a conductive patterns 38, a third interlayer insulating film 39, via plugs 40a to 40l, conductive patterns 41, a fourth interlayer insulating film 42, the conductive contact plugs 43a to 43l, conductive patterns 44, and a fifth interlayer insulating film 45 are formed sequentially on the second interlayer insulating film 36.

Then, a silicon nitride film 46 is formed as an uppermost protection film on the fifth interlayer insulating film 45.

According to the steps of manufacturing the semiconductor device as described above, the source/drain regions 7s, 7d, 8s, 8d are formed by ion-implanting the impurity into both sides of the gate electrodes 13e, 13f respectively in a state that the first insulating film 15 is formed on the upper surfaces of the gate electrodes 13e, 13f in the high-voltage transistor forming area B.

Thus, the first insulating film 15 and the gate electrodes 13e, 13f can prevent the penetration of the ion into the silicon substrate 1.

Also, according to the present embodiment, the source/drain regions and the gate electrodes 13e, 13f are exposed by the photolithography method for patterning the second insulating film 25, without forming sidewalls which are formed by etching back.

Also, steps of patterning the second insulating film 25 include one step for forming the sidewalls 27a to 27d in the low-voltage transistor forming area A and the other step for forming the gate opening portions 25a, 25d and the S/D contact holes 25b, 25c, 25e, 25f in the high-voltage transistor forming area B.

As a result, when the gate opening portions 25a, 25d are formed in the first insulating film 15 and the second insulating film 25, the excessive etching of the element isolation insulating layer 2 can be prevented by covering the element isolation insulating layer 2 with the resist pattern 28.

Meanwhile, the first insulating film 15 is formed thicker than the overlying second insulating film 25. Therefore, if the sidewalls 27a to 27d and the gate opening portions 25a, 25d are formed by the same etching step, it is feared that the element isolation insulating layer 2 exposed in the low-voltage transistor forming area A are etched excessively.

If the element isolation insulating layer 2 are etched excessively, it is feared that recesses which are deeper than the source/drain regions 3s, 3d, 4s, 4d, 5s, 5d, 6s, 6d are formed in side areas of the P-wells 3, 5 and the N-wells 4, 6 in the low-voltage transistor forming area A. Also, if the conductive contact plugs 34a to 34h enter into the recesses, it is feared that the source/drain regions 3s, 3d, 4s, 4d, 5s, 5d and the P-wells 3, 5 or the N-wells 4, 6 are short-circuited. In contrast, according to the present embodiment, the formation of such recesses can be prevented mutually.

Also, according to the present embodiment, after the sidewalls 27a to 27d, the gate opening portions 25a, 25d, and the S/D contact holes 25b, 25c, 25e, 25f are formed, the silicide layers are formed at a time on the surfaces of the gate electrodes 13a to 13f, the source/drain regions 3s, 3d, and the like. As a result, a throughput in forming the silicide can be improved, and a lower resistance of the gate electrodes 13a to 13f can be attained.

FIGS. 4A to 4J are sectional views illustrating steps of forming a semiconductor device according to a second embodiment of the present invention. In FIGS. 4A to 4J, the same reference symbols as those illustrated in FIGS. 1A to 1T denote as the same constituent elements respectively.

Next, steps required until a structure illustrated as FIG. 4A is formed will be explained below.

First, as illustrated in the first embodiment, the element isolation insulating layer 2 are formed on the silicon substrate 1. Then, the first and second P-wells 3, 5 and the first and second N-wells 4, 6 are formed in the low-voltage transistor forming area A, and the third P-well 7 and the third N-well 8 are formed in the high-voltage transistor forming area B. Then, like the first embodiment, the first to third gate insulating films 10, 11, 12 are formed on the surface of the silicon substrate 1 in the low-voltage transistor forming area A and the high-voltage transistor forming area B. Then, the polysilicon film 13 is formed on the first to third gate insulating films 10, 11, 12 and the element isolation insulating layer 2 like the first embodiment.

In the present embodiment, such a structure is employed that the buried channel region is not formed in the upper surface portion of the third N-well 8.

Then, the first insulating film 15 is formed on the polysilicon film 13 into which impurity is not ion-implanted, under the same growth conditions as those in the first embodiment.

Then, a photoresist is coated on the first insulating film 15 and is exposed/developed, and thus the resist pattern 16 is formed, like the first embodiment. The resist pattern 16 is shaped to cover the first insulating film 15 in the high-voltage transistor forming area B and expose the first insulating film 15 in the low-voltage transistor forming area A.

Then, as illustrated in FIG. 4B, and thus the polysilicon film 13 in the low-voltage transistor forming area A is exposed by etching the first insulating film 15 exposed from the resist pattern 16. In this case, an edge of the polysilicon film 13 in the low-voltage transistor forming area A may be positioned on the element isolation insulating layer 2.

The condition for etching the first insulating film 15, i.e., the silicon oxide film, is not particularly limited. However, it is preferable that the dry etching method and the wet etching method may be used in combination, as explained in the first embodiment.

Figure 4C:
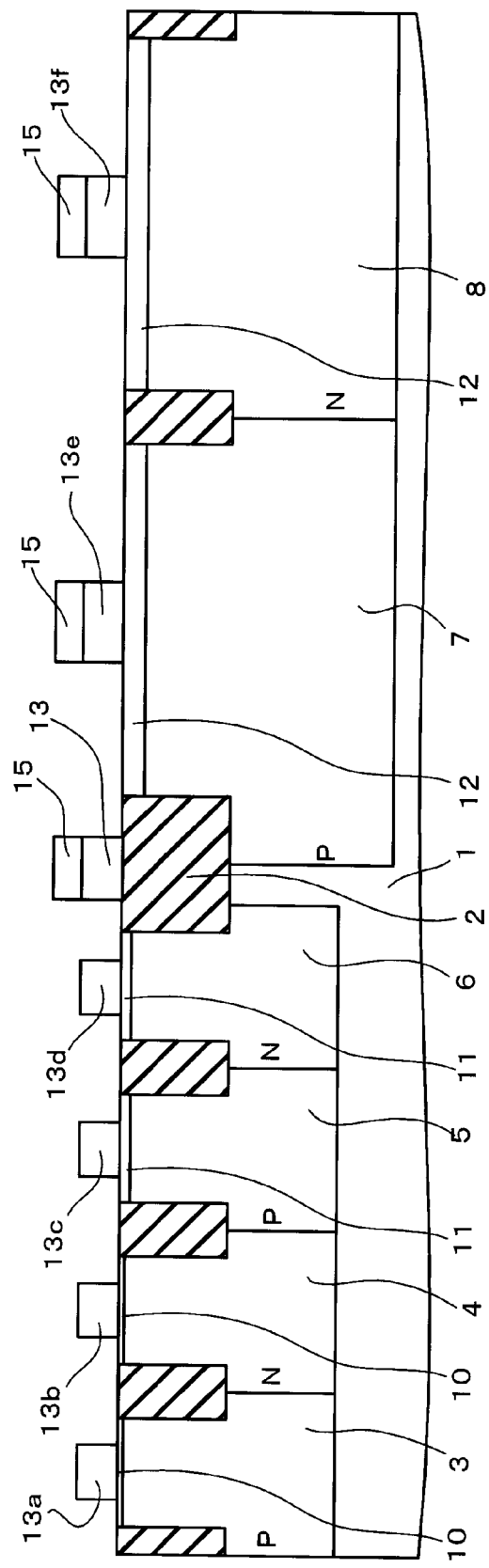

Then, the resist pattern 16 is removed, and then the polysilicon film 13 and the first insulating film 15 are patterned by the similar method to the first embodiment. Thus, as illustrated in FIG. 4C, the first to sixth gate electrodes 13a to 13f are formed. The upper surfaces of the fifth and sixth gate electrodes 13e, 13f in the high-voltage transistor forming area B and the upper surface of the polysilicon film 13 left on the element isolation insulating layer 2 at the periphery of the high-voltage transistor forming area B are covered with the first insulating film 15 respectively.

Then, an n-type impurity and a p-type impurity are ion-implanted into the silicon substrate 1 by the similar method to that illustrated in the first embodiment.

Figure 4D:
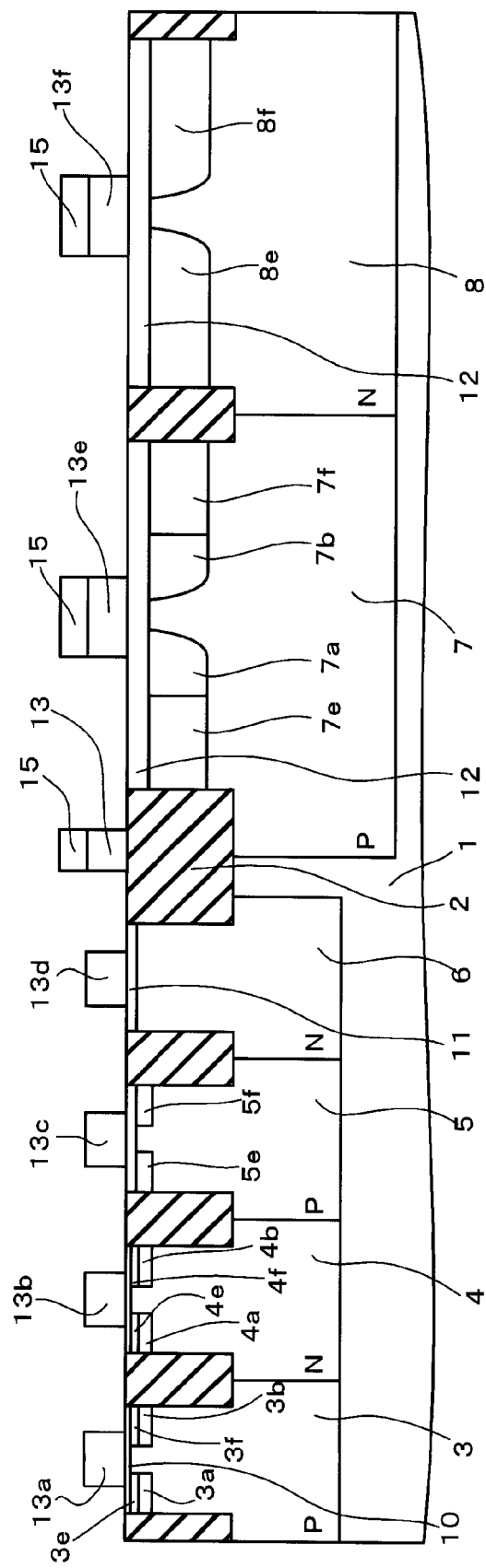

Accordingly, as illustrated in FIG. 4D, the first n-type offset regions 7a, 7b and the second n-type offset regions 7e, 7f are formed in the third P-well 7 on both sides of the fifth gate electrode 13e. Also, the p-type offset regions 8e, 8f are formed in the third N-well 8 on both sides of the sixth gate electrode 13f.

At a time of ion implantation, the first insulating film 15 and the fifth gate electrode 13e can prevent the penetration of ion into the underlying third P-well 7. Thus, the impurity that penetrated the first insulating film 15 is injected into the fifth gate electrode 13e. Also, the first insulating film 15 and the sixth gate electrode 13f can prevent the penetration of ion into the underlying third N-well 8. Thus, the impurity that penetrated the first insulating film 15 is injected into the sixth gate electrode 13f.

Then, the n-type extension regions 3e, 3f and the p-type impurity high-concentration regions 3a, 3b are formed on both sides of the first gate electrode 13a in the first P-well 3. Also, the p-type extension regions 4e, 4f and the n-type impurity high-concentration regions 4a, 4b are formed on both sides of the second gate electrode 13b in the first N-well 4. Also, the n-type extension regions 5e, 5f are formed on both sides of the third gate electrode 13c in the second P-well 5.

Figure 4E:
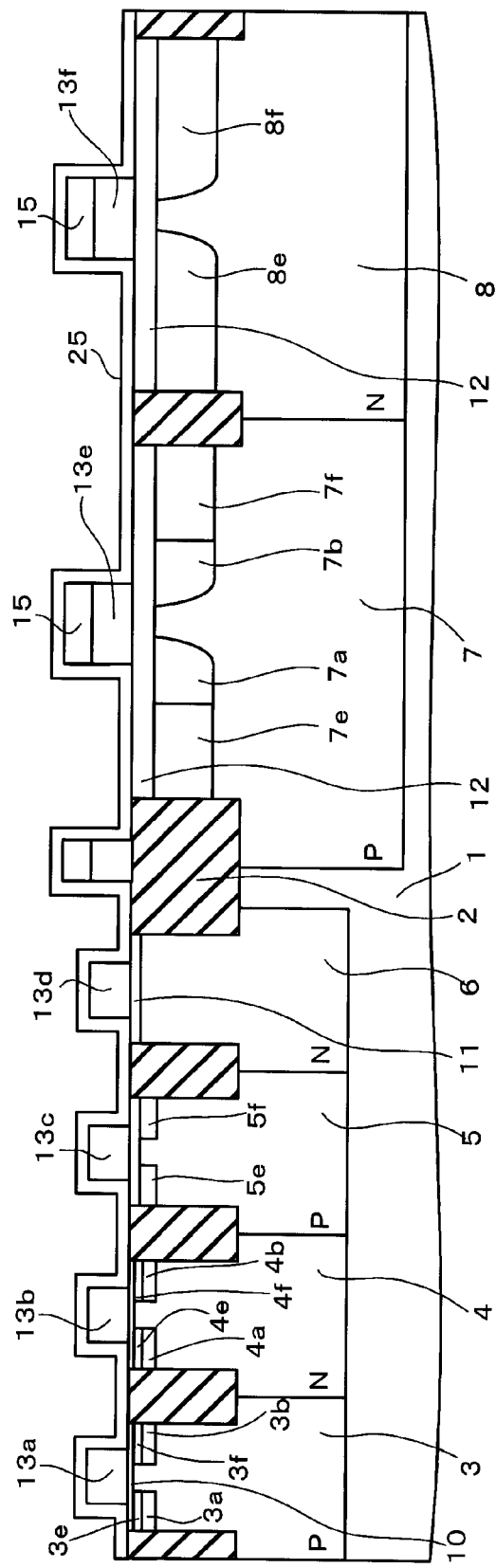

After this, as illustrated in FIG. 4E, the silicon oxide film of 50 nm to 150 nm, e.g., 100 nm thick is formed as the second insulating film 25 on the first to third gate insulating films 10, 11, 12 and the first to sixth gate electrodes 13a to 13f by the CVD method.

Then, the silicon oxide films of the second insulating film 25 and the first and second gate insulating films 10, 11 in the low-voltage transistor forming area A are etched in the almost perpendicular direction under the similar conditions to those in the first embodiment. In this case, the high-voltage transistor forming area B is covered with the resist pattern.

Figure 4F:
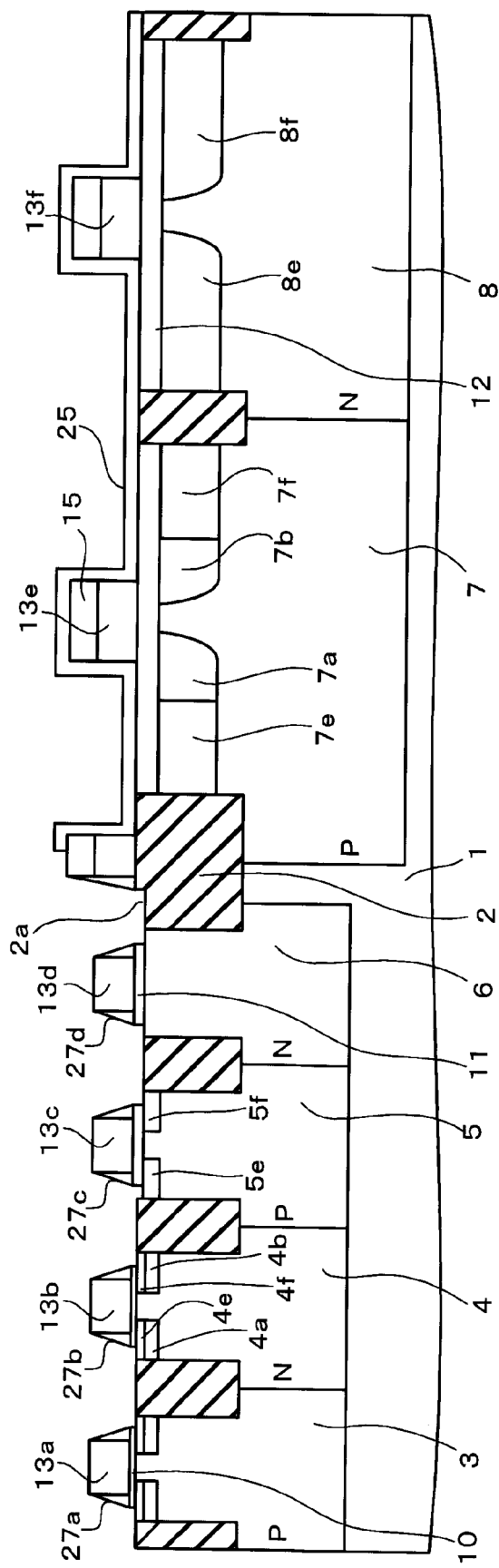

Thus, as illustrated in FIG. 4F, the first and second P-wells 3, 5 and the first and second N-wells 4, 6 are partly exposed, and also the second insulating film 25 is left on respective side surfaces of the first to fourth gate electrodes 13a to 13d as the sidewalls 27a to 27d. In this case, the upper surfaces of the first to fourth gate electrodes 13a to 13d are also exposed.

Also, the silicon oxide film constituting the element isolation insulating layer 2 exposed at the periphery of the low-voltage transistor forming area A is also etched. Thus, the level difference 2a whose depth is substantially equal to a thickness of the second gate insulating film 11 is formed on the element isolation insulating layer 2.

Next, steps required until a structure illustrated as FIG. 4G is formed will be explained bellow.

First, a photoresist is coated over the silicon substrate 1 and is exposed/developed to form the resist pattern 28. The resist pattern 28 covers the high-voltage transistor forming area B, the element isolation insulating layer 2, and the low-voltage transistor forming area A. Also, the resist pattern 28 has the first to sixth openings 28a to 28f on the third P-well 7 and the third N-well 8 in the high-voltage transistor forming area B.

The first opening 28a is formed in the center area of the upper surface of the fifth gate electrode 13e. Also, the second and third openings 28b, 28c are formed in the regions that are apart from the fifth gate electrode 13e and the element isolation insulating layer 2 over a part of the second n-type offset regions 7e, 7f.

Also, the fourth opening 28d is formed over the center area of the upper surface of the sixth gate electrode 13f. Also, the fifth and sixth openings 28e, 28f are formed in the regions that are apart from the sixth gate electrode 13f and the element isolation insulating layer 2 over a part of the p-type offset regions 8e, 8f.

Then, the second insulating film 25, the first insulating film 15, and silicon oxide film constituting the third gate insulating films 12 are etched in the substantially perpendicular direction, using the resist pattern 28 as a mask. The etching conditions are set similarly to those illustrated in the first embodiment.

Thus, the first and second gate opening portions 25a, 25d that expose center areas of the upper surfaces of the fifth and sixth gate electrodes 13e, 13f respectively are formed in the similar positions to those in the first embodiment. At the same time, the S/D contact holes 25b, 25c, 25e, 25f that expose a part of the second n-type offset regions 7e, 7f and the p-type offset regions 8e, 8f respectively are formed in the similar positions to those in the first embodiment.

Accordingly, the S/D contact holes 25b, 25c, 25e, 25f are separated from the gate electrodes 13e, 13f by a predetermined interval. As a result, a reduction of the junction breakdown voltage can be prevented, and it can be prevented that the element isolation insulating layer 2 are exposed. Also, it can be prevented that the first and second gate opening portions 25a, 25d protrude to the periphery of the gate electrode due to displacement of the first and second gate opening portions 25a, 25d.

Figure 4H:
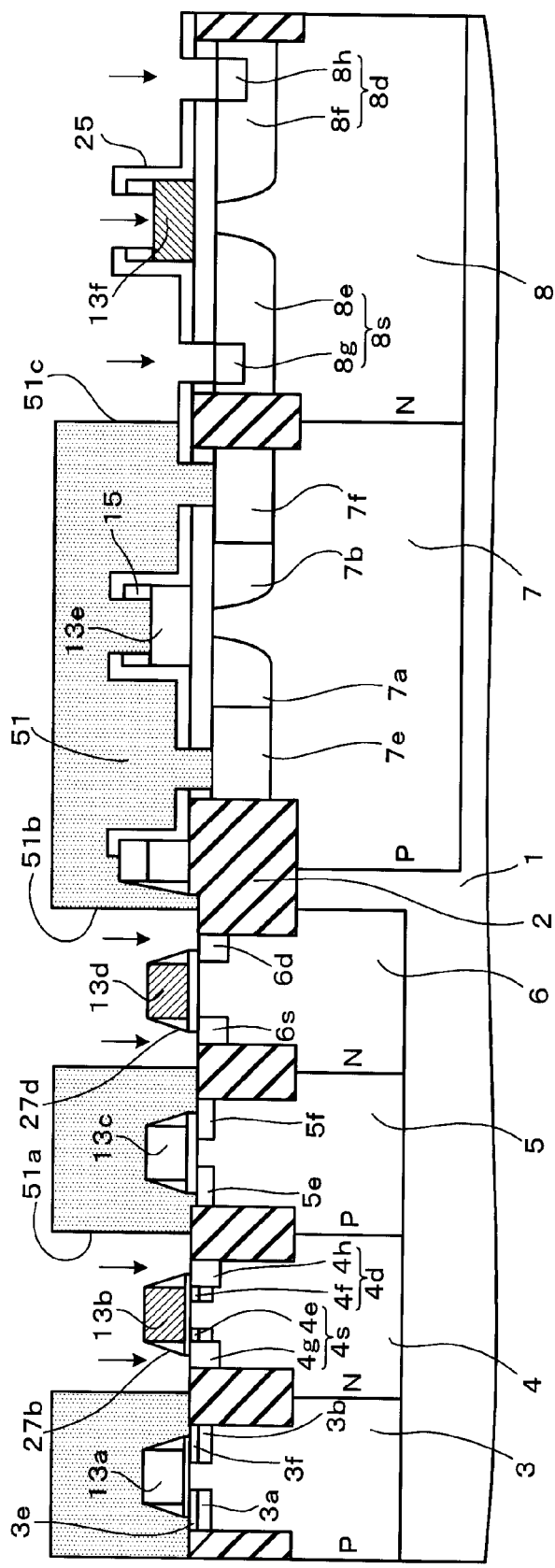

Then, the resist pattern 28 is removed. Then, a photoresist is coated newly over the silicon substrate 1, and then is exposed/developed. Thus, as illustrated in FIG. 4H, a resist pattern 51 is formed.

The resist pattern 51 has openings 51a, 51b, 51c that expose areas of the first, second, and third N-wells 4, 6, 8 individually. In this case, the first, second, and third P-wells 3, 5, 7 are covered with the resist pattern 51.

Then, the p-type impurity ion, i.e., boron ion, is implanted into the first and second N-wells 4, 6 and the p-type offset regions 8e, 8f through the openings 51a, 51b, 51c, using the resist pattern 51 as a mask. In this case, the second and fourth gate electrodes 13b, 13d, the sidewalls 27b, 27d, and the second insulating film 25 are used as a mask.

As the ion implantation conditions, for example, an acceleration of the boron ion is set to 5 keV and a dosage is set to $2.0 \times 10^{15}$ cm$^{-2}$.

Thus, the p-type impurity high-concentration regions 4g, 4h are formed on both sides of the second gate electrode 13b in the first N-well 4. The p-type impurity high-concentration regions 4g, 4h and the p-type extension regions 4e, 4f constitute the p-type source/drain regions 4s, 4d.

Also, the p-type impurity high-concentration regions are formed as the p-type source/drain regions 4s, 4d on both sides of the fourth gate electrode 13d in the second N-well 6.

The p-type impurity high-concentration regions 8g, 8h are formed on both sides of the sixth gate electrode 13f in the p-type offset regions 8e, 8f. The p-type impurity high-concentration regions 8g, 8h and the p-type offset regions 8e, 8f constitute the p-type source/drain regions 8s, 8d.

Also, the p-type impurity ion is implanted into the second and fourth gate electrodes 13b, 13d, and also is implanted into the sixth gate electrode 13f through the second gate opening portion 25d. Thus, resistances of the second, fourth, and sixth gate electrodes 13b, 13d, 13f are lowered, and these electrodes are formed as the conductive patterns.

Figure 4I:
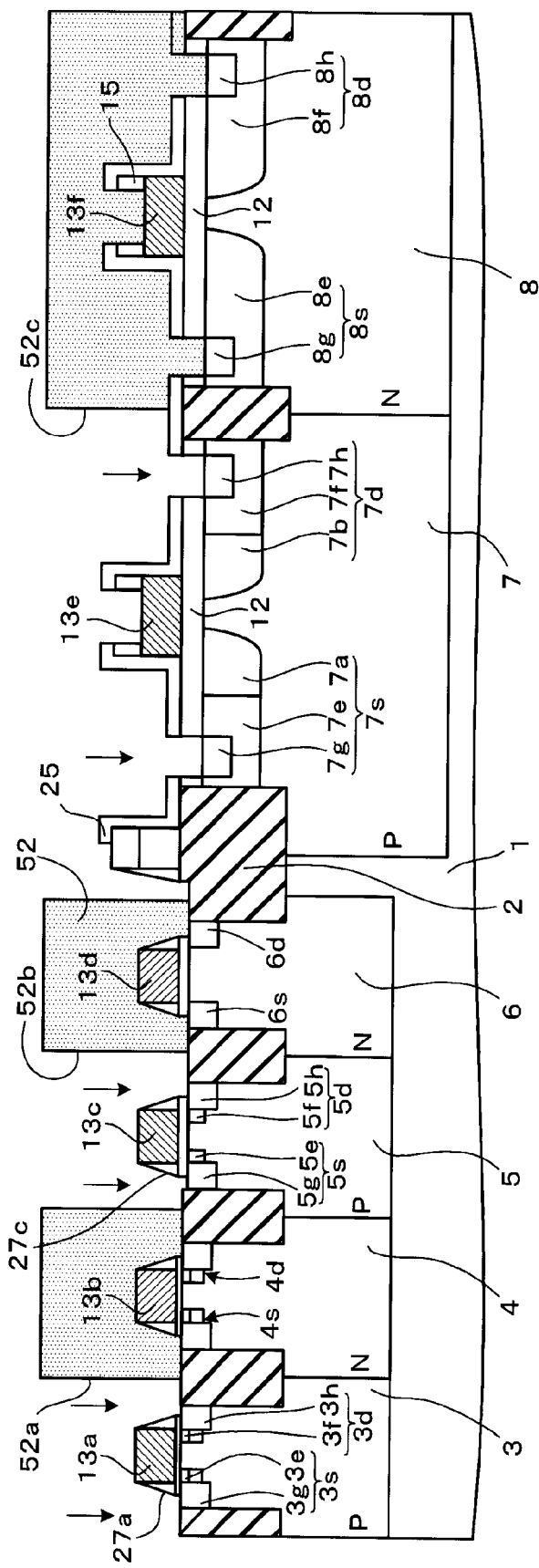

Then, the resist pattern 51 is removed. Then, a photoresist is coated over the silicon substrate 1, and then exposed/developed. Thus, as illustrated in FIG. 4I, a resist pattern 52 is formed.

The resist pattern 52 has openings 52a, 52b, 52c that expose the first, second, and third P-wells 3, 5, 7 individually. In this case, the first, second, and third N-wells 4, 6, 8 are covered with the resist pattern 52.

Then, a phosphorus ion as the n-type impurity ion is implanted into the first and second P-wells 3, 5 and the second n-type offset regions 7e, 7f in the third P-well 7 through the openings 52a, 52b, 52c while using the resist pattern 52 as a mask. In this case, the first and third gate electrodes 13a, 13c, the sidewalls 27a, 27c, and the second insulating film 25 act as a mask.

As the ion implantation conditions, for example, an acceleration of the phosphorus ion of 13 keV and a dosage of $2.0 \times 10^{15}$ cm$^{-2}$ are set.

Accordingly, the n-type impurity high-concentration regions 3g, 3h are formed on both sides of the first gate electrode 13a in the first P-well 3. The n-type impurity high-concentration regions 3g, 3h and the n-type extension regions 3e, 3f connected to them constitute the n-type source/drain regions 3s, 3d.

Also, the n-type impurity high-concentration regions 5g, 5h are formed on both sides of the third gate electrode 13c in the second P-well 5. The n-type impurity high-concentration regions 5g, 5h and the n-type extension regions 5e, 5f constitute the n-type source/drain regions 5s, 5d.

The n-type impurity high-concentration regions 7g, 7h are formed on both sides of the fifth gate electrode 13e in the second n-type offset regions 7e, 7f. The n-type impurity high-concentration regions 7g, 7h and the first and second n-type offset regions 7a, 7b, 7e, 7f constitute the n-type source/drain regions 7s, 7d.

Also, the n-type impurity ion is implanted into the first and third gate electrodes 13a, 13c, and also is implanted into the fifth gate electrode 13e through the first gate opening portion 25a. Thus, resistances of the first, third, and fifth gate electrodes 13a, 13c, 13e are lowered, and these electrodes are formed as the conductive patterns.

Then, the resist pattern 52 is removed.

Figure 4J:
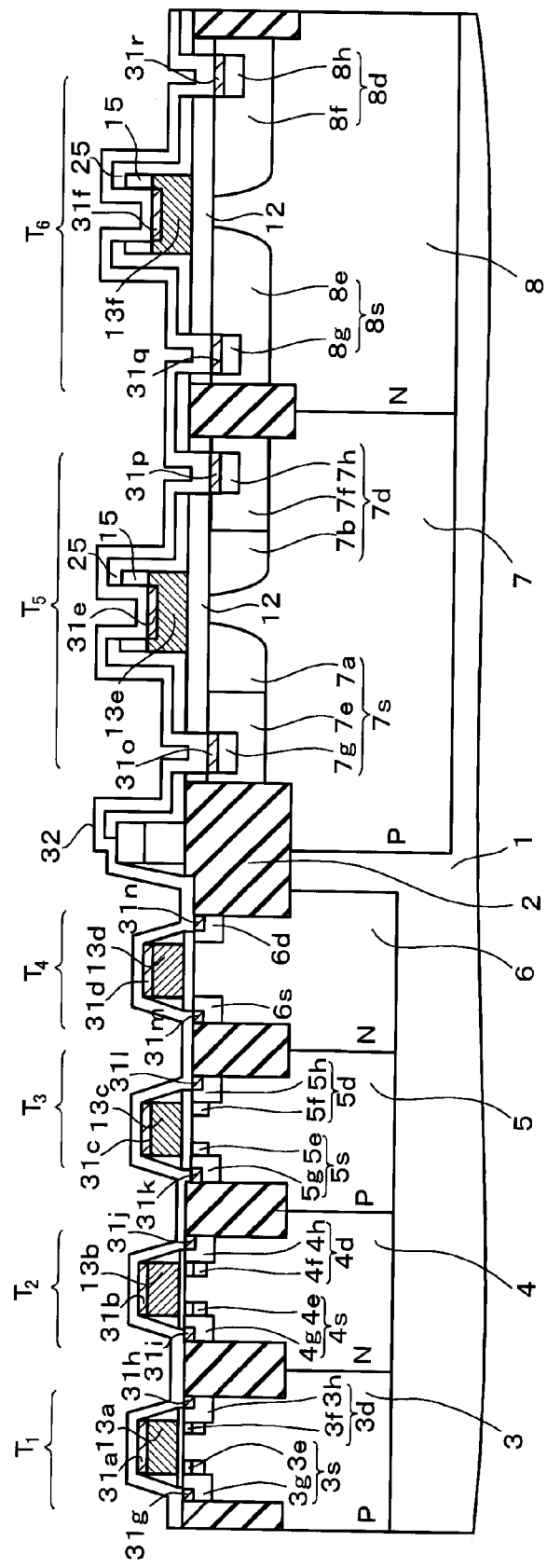

Next, steps required until a structure illustrated in FIG. 4J is formed will be explained hereunder.

First, the silicide layers 31a to 31f are formed on the upper surfaces of the first to sixth gate electrodes 13a to 13f respectively by the method illustrated as the first embodiment. At the same time, the silicide layers 31g to 31r are formed on the surfaces of the n-type impurity high-concentration regions 3g, 3h, 5g, 5h, 7g, 7h and the p-type impurity high-concentration regions 4g, 4h, 6g, 6h, 8g, 8h respectively.

Here, when the polysilicon film 13 left on the element isolation insulating layer 2 is exposed, a silicide layer is formed on the surface of the polysilicon film 13.

According to the above steps, like the first embodiment, the first to third NMOS transistors $T_1$, $T_3$, $T_5$ and the first to third PMOS transistors $T_2$, $T_4$, $T_6$ are formed.

Then, the third insulating film 32, e.g., the silicon nitride film for covering the first to third NMOS transistors $T_1$, $T_3$, $T_5$, the first to third PMOS transistors $T_2$, $T_4$, $T_6$, the second insulating film 25, and the like is formed by the plasma CVD method.

After this, the first interlayer insulating film 33, and others are formed. In this case, these steps are similar to those in the first embodiment.

In the above steps, the impurity ion to form the n-type impurity high-concentration regions 3g, 3h, 5g, 5h, 7g, 7h and the p-type impurity high-concentration regions 4g, 4h, 6g, 6h, 8g, 8h is introduced into the first to sixth gate electrodes 13a to 13f. Thus, the ion implanting step applied merely to lower the resistance of the first to sixth gate electrodes 13a to 13f can be omitted, and a throughput of manufacturing the semiconductor device can be improved.

Also, the first insulating film 15 is formed on the gate electrodes 13e, 13f in the high-voltage transistor forming area B like the first embodiment. As a result, the penetration of the impurity ion into the gate electrodes 13e, 13f can be prevented at a time of the ion implantation applied to form the n-type offset regions 7a, 7b, 7e, 7f and the p-type offset regions 8e, 8f.

Also, the formation of the sidewalls 27a to 27d in the low-voltage transistor forming area A and the formation of the gate opening portions 25a, 25d and the S/D contact holes 25b, 25c, 25e, 25f in the high-voltage transistor forming area B are another processes.

Therefore, when the gate opening portions 25a, 25d and the S/D contact holes 25b, 25c, 25e, 25f are formed in the first insulating film 15 and the second insulating film 25, the excessive etching of the element isolation insulating layer 2 can be prevented, like the first embodiment.

Also, the silicide layers 31a to 31r are formed at a time on the surfaces of the gate electrodes 13a to 13f, the n-type impurity high-concentration regions 3g, 3h, 5g, 5h, 7g, 7h and the p-type impurity high-concentration regions 4g, 4h, 6g, 6h, 8g, 8h in the low-voltage transistor forming area A and the high-voltage transistor forming area B respectively. As a result, a throughput in manufacturing the semiconductor device can be improved.

Figure 5A:
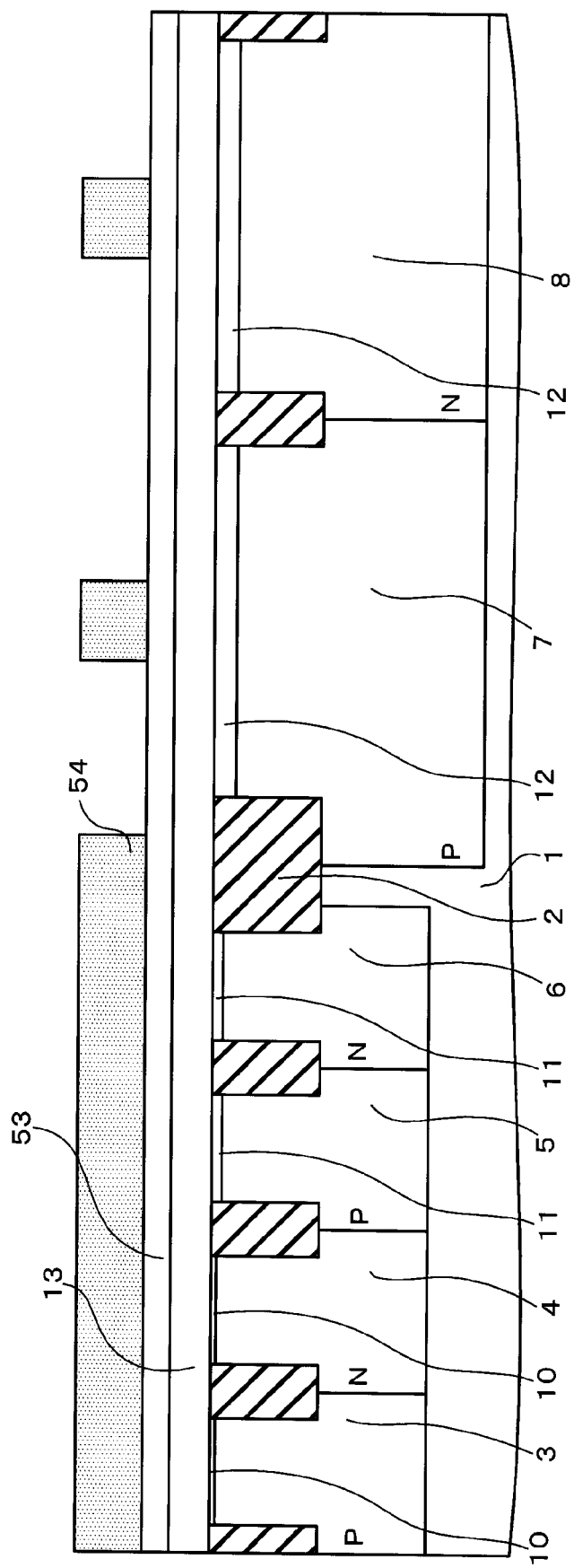
FIGS. 5A to 5O are sectional views illustrating steps of forming a semiconductor device according to a third embodiment of the present invention.

FIGS. 5A to 5O are sectional views illustrating steps of forming a semiconductor device according to a third embodiment of the present invention. In FIGS. 5A to 5O, the same reference symbols as those illustrated in FIGS. 4A to 4J denote the same constituent elements respectively.

First, in FIG. 5A, the element isolation insulating layer 2 are formed on the silicon substrate 1 like the second embodiment. Then, the first and second P-wells 3, 5 and the first and second N-wells 4, 6 are formed in the low-voltage transistor forming area A, and also the third P-well 7 and the third N-well 8 are formed in the high-voltage transistor forming area B.

Then, the first to third gate insulating films 10, 11, 12 are formed on the surface of the silicon substrate 1 in the low-voltage transistor forming area A and the high-voltage transistor forming area B like the second embodiment. Then, like the second embodiment, the polysilicon film 13 is formed on the first to third gate insulating films 10, 11, 12 and the element isolation insulating layer 2.

Then, a silicon nitride film of 150 nm thickness is formed as a first insulating film 53 on the polysilicon film 13, into which no impurity is ion-implanted, by the CVD method.

Then, a photoresist is coated on the first insulating film 53 and then is exposed/developed, and thus a resist pattern 54 for high-voltage gate electrode formation is formed.

The resist pattern 54 covers the low-voltage transistor forming area A, and has a planar shape of the gate electrode over the third P-well 7 and the third N-well 8 in the high-voltage transistor forming area B respectively. In this case, the element isolation insulating layer 2 located on the boundary between the low-voltage transistor forming area A and the high-voltage transistor forming area B may be covered with the resist pattern 54.

Then, the first insulating film 53 and the polysilicon film 13 are etched, using the resist pattern 54 as a mask.

In the etching of the first insulating film 53, for example, the dry etching using $C_4F_3$, $CHF_3$, and oxygen ($O_2$) is used. In this case, the dry etching and the wet etching may be used in combination like the first embodiment. Also, the etching conditions of the polysilicon film 13 are set similarly to those in the second embodiment.

Figure 5B:
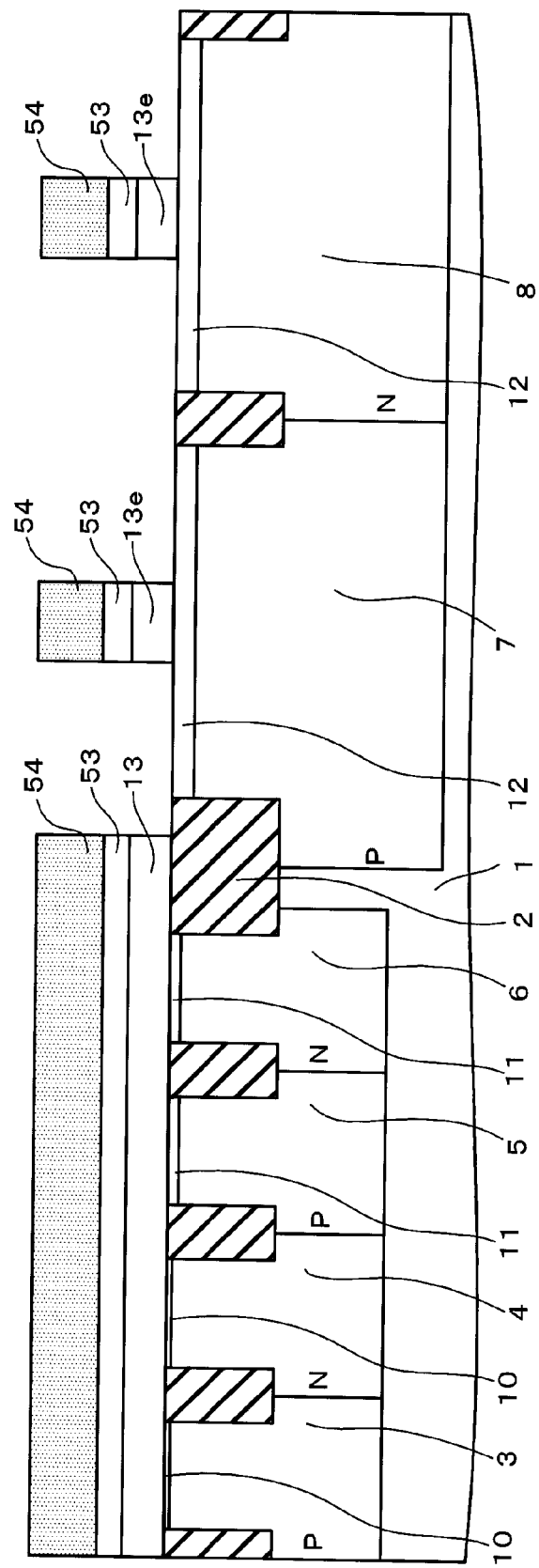

The polysilicon film 13 in the high-voltage transistor forming area B is patterned by this etching. Thus, as illustrated in FIG. 5B, the fifth and sixth gate electrodes 13e, 13f are formed. The fifth and sixth gate electrodes 13e, 13f are formed on the third P-well 7 and the third N-well 8 via the third gate insulating film 12 respectively.

Figure 5C:
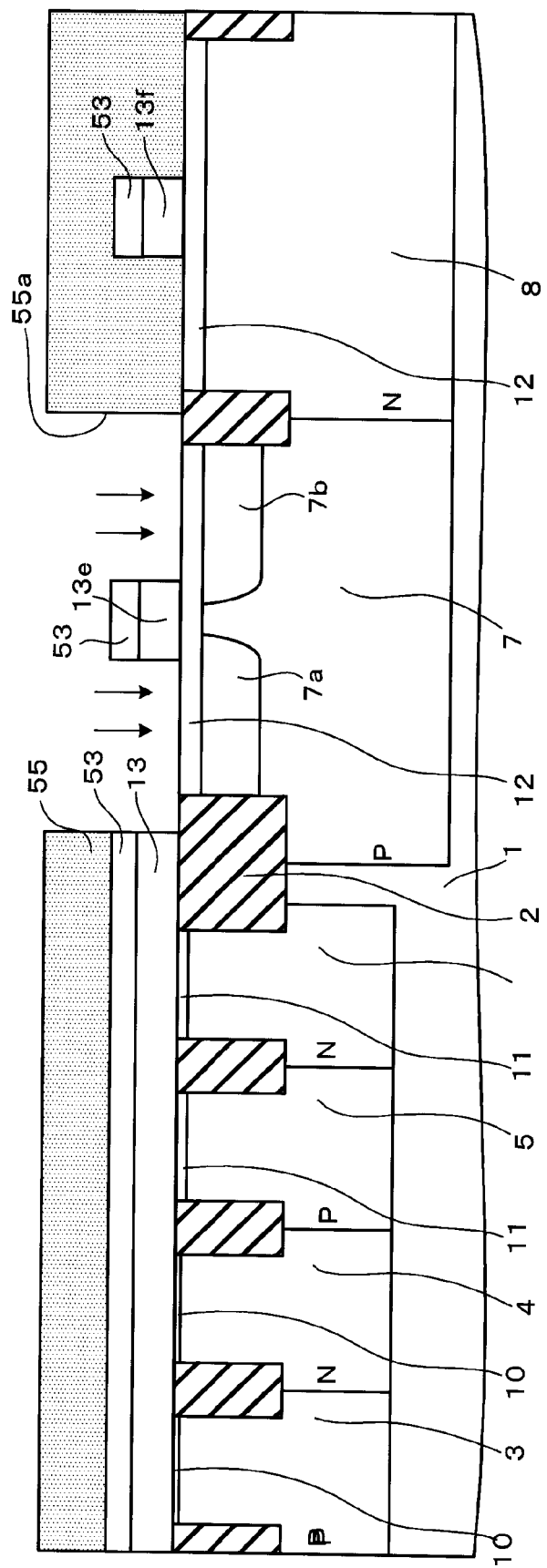

Then, the resist pattern 54 is removed. Then, a photoresist is coated newly over the silicon substrate 1 and then exposed/developed. Thus, as illustrated in FIG. 5C, a resist pattern 55 is formed.

The resist pattern 55 has an opening 55a to expose the upper area of the third P-well 7, and has a shape to cover the low-voltage transistor forming area A and the third N-well 8.

Then, a phosphorus ion is implanted into the third P-well 7 through the opening 55a while using the resist pattern 55 as a mask. In this case, the fifth gate electrode 13e and the overlying first insulating film 53 act as a mask. Thus, two first n-type offset regions 7a, 7b that are separated below the fifth gate electrode 13e are formed in the third P-well 7. The conditions of the phosphorus ion implantation are set similar to those applied in the steps of forming the first n-type offset regions 7a, 7b in the first embodiment.

Figure 5D:
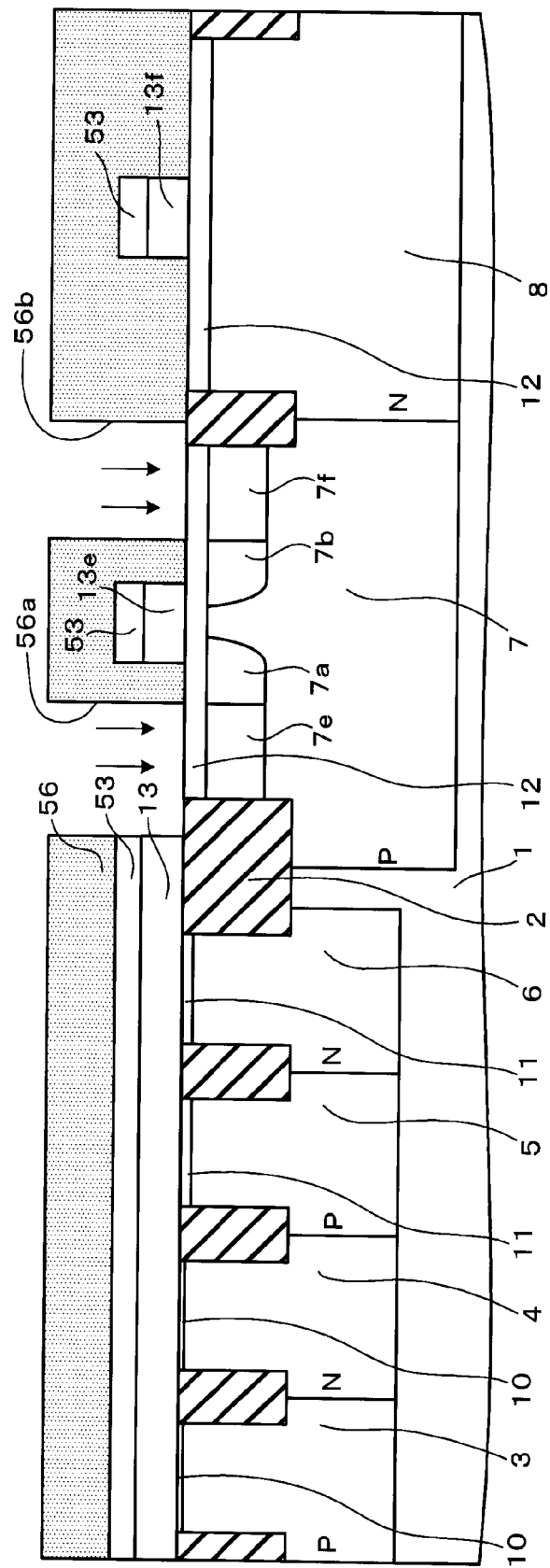

Then, the resist pattern 55 is removed. Then, a photoresist is coated newly over the silicon substrate 1, and then is exposed/developed. Thus, as illustrated in FIG. 5D, a resist pattern 56 is formed.

The resist pattern 56 covers the low-voltage transistor forming area A and the third N-well 8 and covers the fifth gate electrode 13e and its neighborhood, and has openings 56a, 56b to expose the first n-type offset regions 7a, 7b on both sides of the fifth gate electrode 13e.

Then, a phosphorus ion is implanted into the third P-well 7 through the openings 56a, 56b by using the resist pattern 56 as a mask. Thus, the second n-type offset regions 7e, 7f of high impurity concentration are formed in positions that are apart from the fifth gate electrode 13e. The phosphorus ion implantation in this case is executed under the same conditions as those of the steps of forming the second n-type offset regions 7e, 7f in the first embodiment.

Figure 5E:
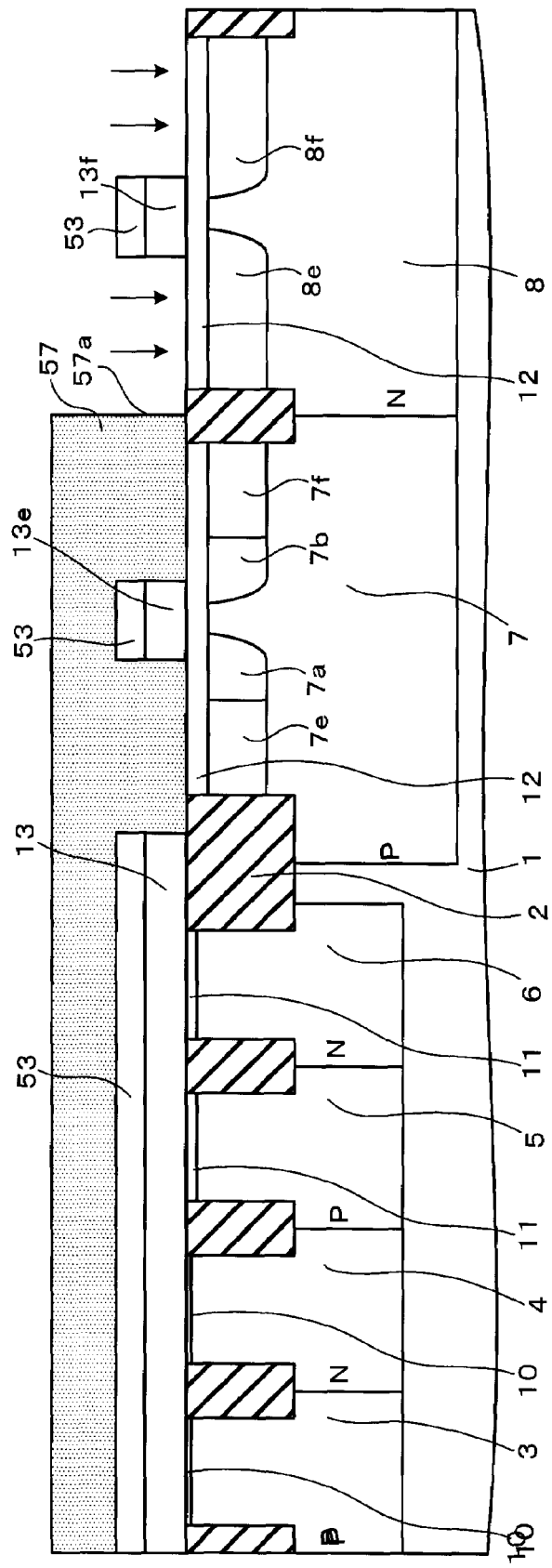

Next, the resist pattern 56 is removed. Then, a photoresist is coated newly over the silicon substrate 1 and then is exposed/developed. Thus, as illustrated in FIG. 5E, a resist pattern 57 is formed. The resist pattern 57 has an opening 57a to expose the third N well 8, and has a shape to the low-voltage transistor forming area A and the third P-well 7.

Then, a boron ion is implanted into the third N-well 8 through the opening 57a while using the resist pattern 57 as a mask. Thus, the p-type offset regions 8e, 8f are formed on both sides of the sixth gate electrode 13f. The boron ion implantation in this case is executed under the same conditions as those of the steps of forming the p-type offset regions 8e, 8f in the second embodiment.

In the above ion implantation step, the first insulating film 53 is formed on the fifth and sixth gate electrodes 13e, 13f, and therefore the penetration of the impurity ion into the silicon substrate 1 can be prevented.

Then, the resist pattern 57 is removed.

Figure 5F:
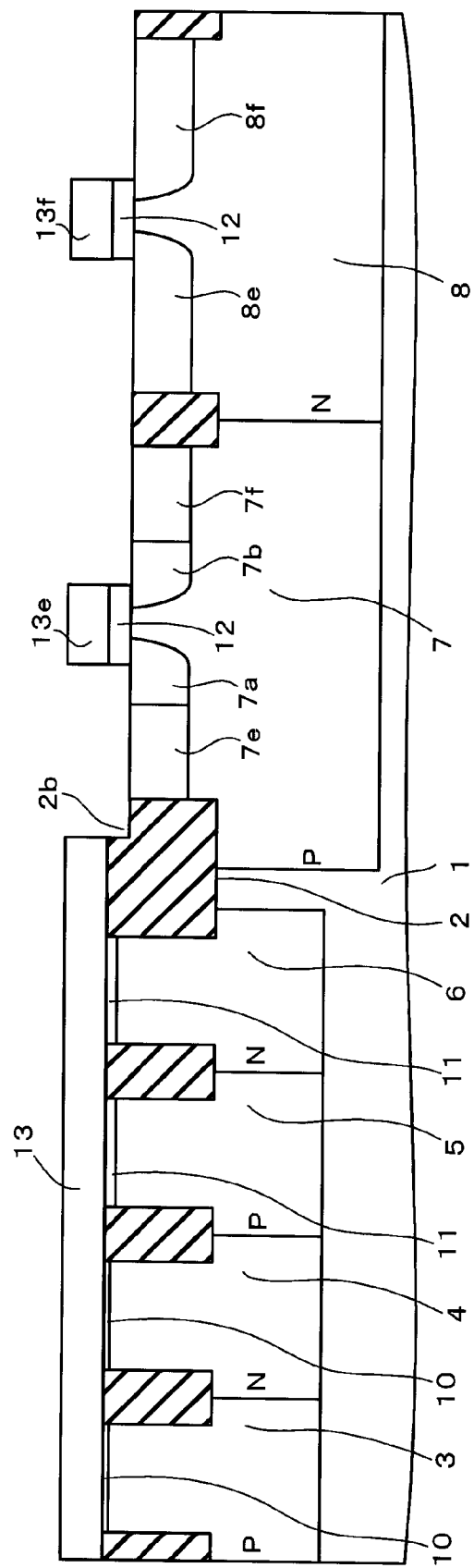

Next, steps required until a structure illustrated as FIG. 5F is formed will be explained hereunder.

First, the third gate insulating film 12 exposed on both sides of the fifth and sixth gate electrodes 13e, 13f respectively is etched. As the etching method, the dry etching using a mixed gas of $CHF_3$, $CF_4$, and Ar is employed.

In this case, the element isolation insulating layer 2 exposed in the periphery of the high-voltage transistor forming area B is also formed of the silicon oxide film. Therefore, the element isolation insulating layer 2 is etched in this etching and is thinned, and a level difference 2b occurs.

Then, the first insulating film 53 formed of the silicon nitride is removed. As the etching method, the dry etching using a mixed gas of $C_4F_3$, $CHF_3$, and $O_2$ is used. Thus, the upper surfaces of the polysilicon film 13 and the fifth and sixth gate electrodes 13e, 13f are exposed.

Figure 5G:
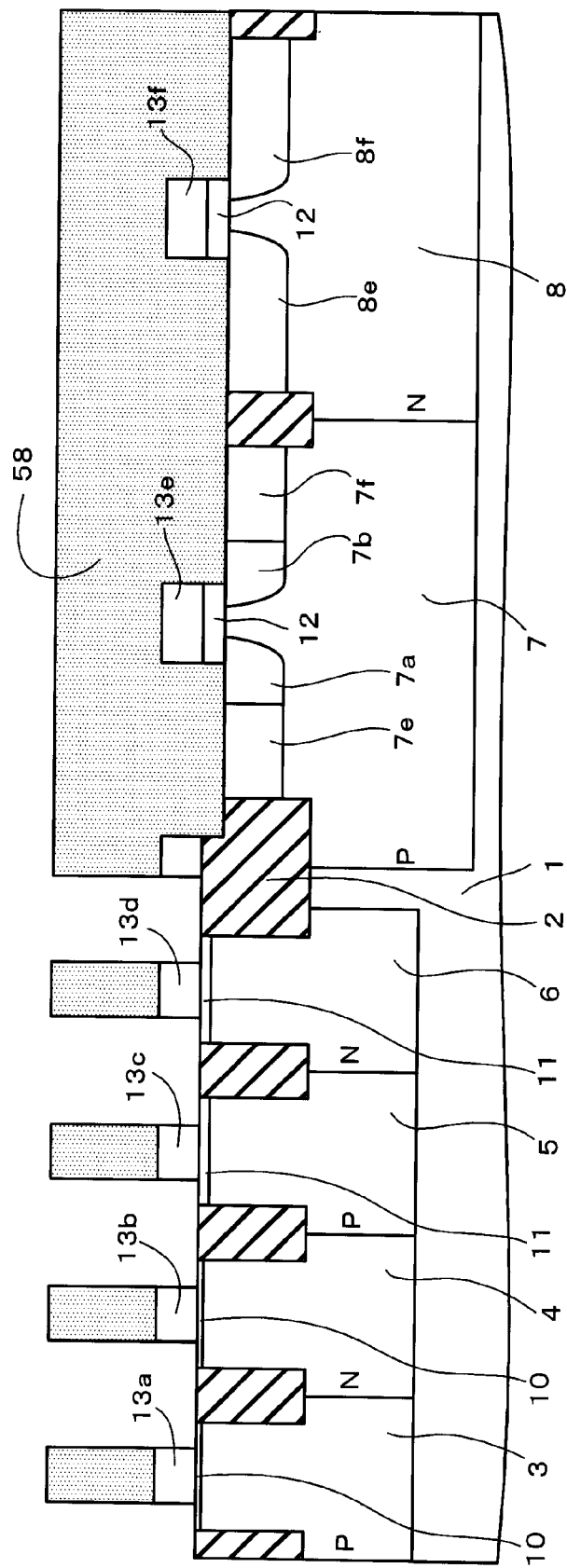

Next, steps required until a structure illustrated as FIG. 5G is formed will be explained bellow.

First, a photoresist is coated over the silicon substrate 1, and then is exposed/developed. Thus, a resist pattern 58 for formation of the middle voltage gate electrode is formed.

The resist pattern 58 has a planar shape of the gate electrode on the first and second P-wells 3, 5 and the first and second N-wells 4, 6 in the low-voltage transistor forming area A respectively. Also, the resist pattern 58 is shaped to cover the high-voltage transistor forming area B and its periphery.

After this, the polysilicon film 13 is etched, using the resist pattern 58 as a mask.

The polysilicon film 13 in the low-voltage transistor forming area A is patterned by this etching, and thus the first to fourth gate electrodes 13a, 13b, 13c, 13d are formed. The first and second gate electrodes 13a, 13b are formed on the first P-well 3 and the first N-well 4 via the first insulating film 10 respectively. Also, the third and fourth gate electrodes 13c, 13d are formed on the second P-well 5 and the second N-well 6 via the second insulating film 11 respectively.

Here, in FIG. 5G, after patterning of the polysilicon film 13, a part of the polysilicon film 13 is left on the element isolation insulating layer 2 at the boundary between the low-voltage transistor forming area A and the high-voltage transistor forming area B.

Then, as illustrated in FIG. 5H, the n-type extension regions 3e, 3f and the p-type impurity high-concentration regions 3a, 3b are formed in the first P-well 3 on both sides of the first gate electrode 13a by the similar method illustrated as the first embodiment. Also, the p-type extension regions 4e, 4f and the n-type impurity high-concentration regions 4a, 4b are formed in the first N-well 4 on both sides of the second gate electrode 13b. Also, the n-type extension regions 5e, 5f are formed in the second P-well 5 on both sides of the third gate electrode 13c.

Figure 5I:
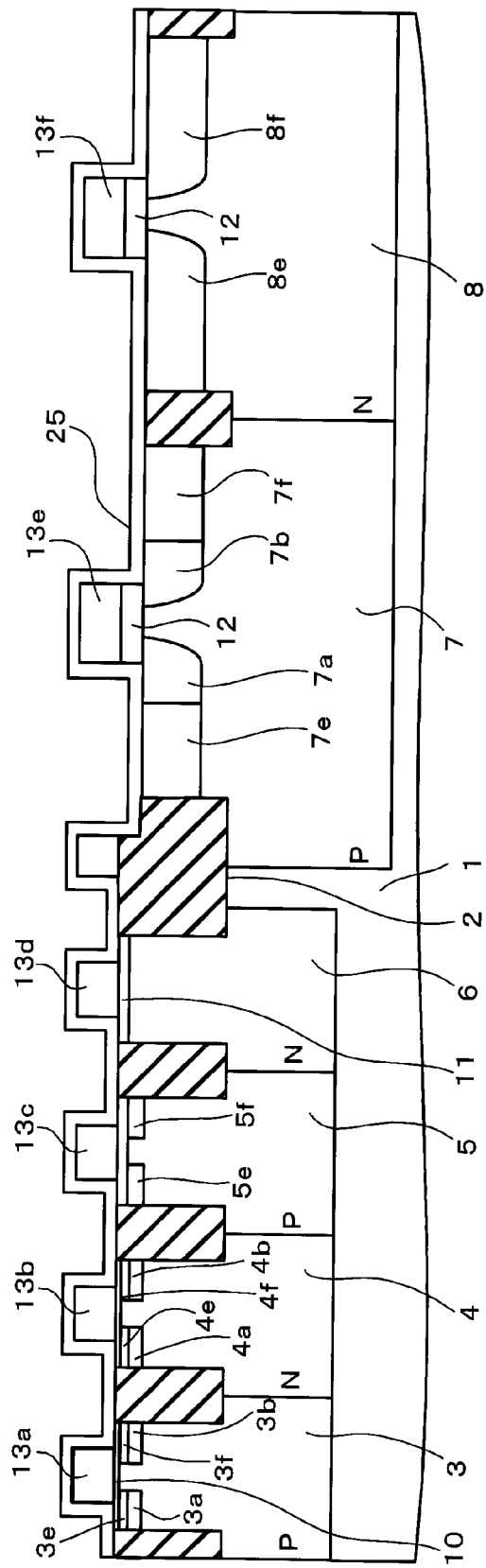

Then, as illustrated in FIG. 5I, the silicon oxide film of 100 nm thick is formed as the second insulating film 25 on the first to third gate insulating films 10, 11, 12, the first to sixth gate electrodes 13a to 13f, and the element isolation insulating layer 2 by the CVD method.

Figure 5J:
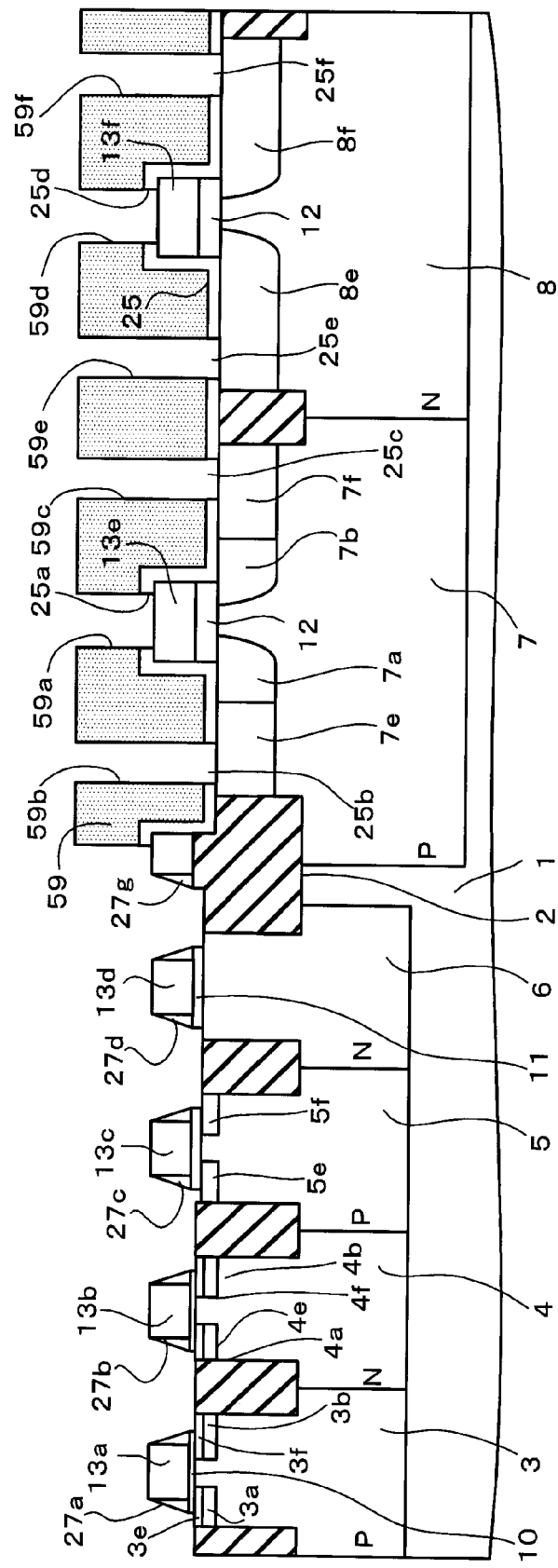

Next, steps required until a structure illustrated as FIG. 5J is formed will be explained bellow.

First, a photoresist is coated on the second insulating film 25, and then is exposed/developed, and thus a resist pattern 59 is formed. The resist pattern 59 exposes the second insulating film 25 in the low-voltage transistor forming area A, and has first to sixth openings 59a to 59f on the third P-well 7 and the third N-well 8 in the high-voltage transistor forming area B.

The first opening 59a is formed in the center area of the upper surface of the fifth gate electrode 13e. Also, the second and third openings 59b, 59c are formed in the areas that are apart from the fifth gate electrode 13e and the element isolation insulating layer 2 over a part of the second n-type offset regions 7e, 7f respectively.

The fourth opening 59d is formed in the center area of the upper surface of the sixth gate electrode 13f. Also, the fifth and sixth openings 59e, 59f are formed in the areas that are apart from the sixth gate electrode 13f and the element isolation insulating layer 2 over a part of the p-type offset regions 8e, 8f respectively.

Then, silicon oxide film constituting the second insulating film 25 and the first and second gate insulating films 10, 11 is etched in the substantially perpendicular direction, using the resist pattern 59 as a mask.

According to this etching, the second insulating film 25 is left as the sidewalls 27a to 27d on the side surfaces of the first to fourth gate electrodes 13a to 13d in the low-voltage transistor forming area A.

At the same time, the silicon oxide film constituting the second insulating film 25 is etched through the first and fourth opening 59a, 59d in the high-voltage transistor forming area B. Thus, the first and second gate opening portions 25a, 25d that expose the upper center area of the fifth and sixth gate electrodes 13e, 13f respectively are formed. Also, the third gate insulating film 12 is etched through the second, third, fifth and sixth openings 59b, 59c, 59e, 59f. Thus, the S/D contact holes 25b, 25c, 25e, 25f that expose a part of the second n-type offset regions 7e, 7f and the p-type offset regions 8e, 8f are formed.

The first and second gate opening portions 25a, 25d and the S/D contact holes 25b, 25c, 25e, 25f are formed in the same positions as those in the first embodiment.

In this state, the first insulating film illustrated as the second embodiment is not formed on the fifth and sixth gate electrodes 13e, 13f. Therefore, an etching time of the first insulating film can be shortened in contrast to the second embodiment.

Here, a sidewall 27g is formed on one side wall of the polysilicon film 13 left on the element isolation insulating layer 2 around the high-voltage transistor forming area B. Also, the other side wall of the polysilicon film 13 is covered with the second insulating film 25 and the resist pattern 59.

After such etching is completed, the resist pattern 59 is removed.

Figure 5K:
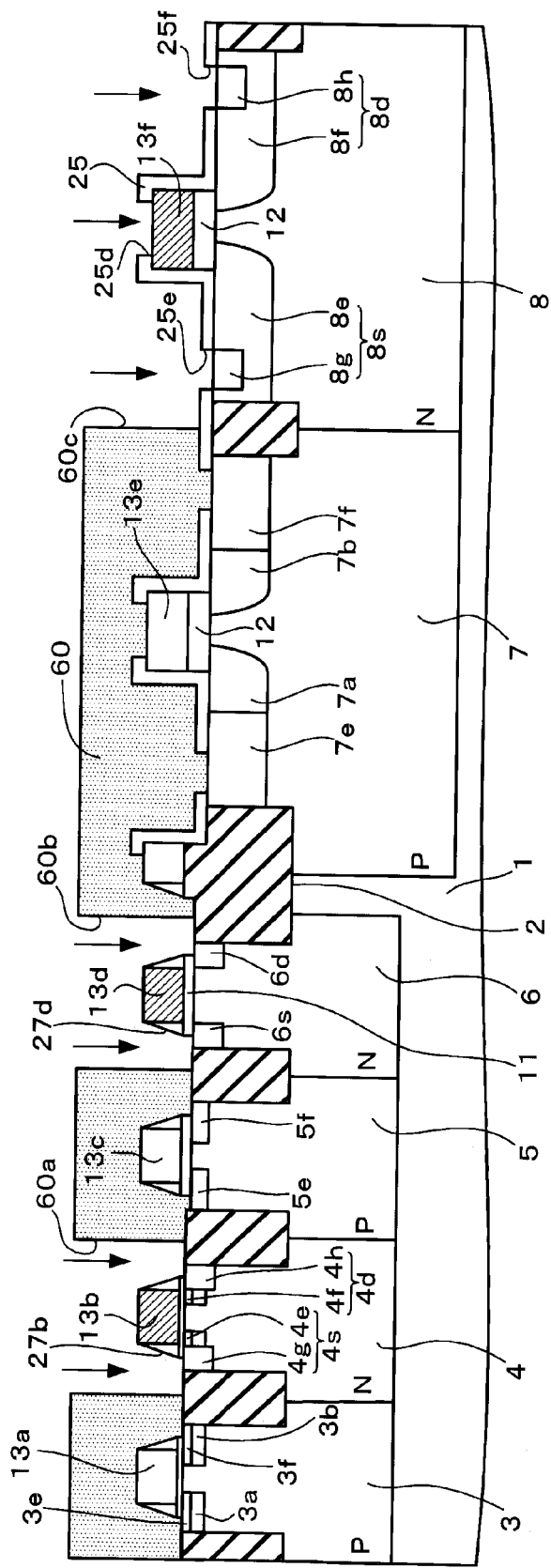

Then, a photoresist is coated over the silicon substrate 1 and then is exposed/developed. Thus, as illustrated in FIG. 5K, a resist pattern 60 is formed.

The resist pattern 60 has openings 60a, 60b, 60c that expose regions of the first N-well 4, 6, 8 individually. Here, the first, second, and third P-wells 3, 5, 7 are covered with the resist pattern 60.

Then, a boron ion as the p-type impurity is implanted into the first and second N-wells 4, 6 and the p-type offset regions 8e, 8f through the openings 60a, 60b, 60c and the S/D contact holes 25d, 25e, 25f, using the resist pattern 60 as a mask. In this case, the gate electrodes 13b, 13d, the sidewalls 27b, 27d, and the second insulating film 25 function as a mask. The ion implantation conditions in this case are set to the same ion implantation conditions applied to the case where the ion is implanted by using the resist pattern 51 in the second embodiment.

Thus, the p-type impurity high-concentration regions 4g, 4h are formed on both sides of the second gate electrode 13b in the first N-well 4. The p-type impurity high-concentration regions 4g, 4h and the p-type extension regions 4e, 4f constitute the p-type source/drain regions 4s, 4d. Also, the p-type impurity high-concentration regions as the p-type source/drain regions 6s, 6d are formed on both sides of the fourth gate electrode 13d in the second N-well 6.

The p-type impurity high-concentration regions 8g, 8h are formed on both sides of the sixth gate electrode 13f in the p-type offset regions 8e, 8f. The p-type impurity high-concentration regions 8g, 8h and the p-type offset regions 8e, 8f constitute the p-type source/drain regions 8s, 8d.

Also, the p-type impurity ion is implanted into the second and fourth gate electrodes 13b, 13d, and also implanted into the sixth gate electrode 13f through the second gate opening portion 25d. Thus, resistances of the second, fourth, and sixth gate electrodes 13b, 13d, 13f are lowered, and these electrodes are formed as the conductive patterns.

Then, the resist pattern 60 is removed. Then, a photoresist is coated newly over the silicon substrate 1, and then is exposed/developed. Thus, as illustrated in FIG. 5L, a resist pattern 61 is formed.

The resist pattern 61 has openings 61a, 61b, 61c that expose individually the first, second, and third P-wells 3, 5, 7. In this case, the first, second, and third N-wells 4, 6, 8 are covered with the resist pattern 61.

Then, a phosphorus ion as the n-type impurity ion is implanted into the first and second P-wells 3, 5 and the second n-type offset regions 7e, 7f through the openings 61a, 61b, 61c and the S/D contact holes 25b, 25c while using the resist pattern 61 as a mask. In this case, the first and third gate electrodes 13a, 13c, the sidewalls 27a, 27c, and the second insulating film 25 act as a mask. The ion implantation conditions in this case are set to the same ion implantation conditions applied to the case where the ion is implanted by using the resist pattern 52 in the second embodiment.

Accordingly, the n-type impurity high-concentration regions 3g, 3h are formed on both sides of the first gate electrode 13a in the first P-well 3. The n-type impurity high-concentration regions 3g, 3h and the n-type extension regions 3e, 3f constitute the n-type source/drain regions 3s, 3d. Also, the n-type impurity high-concentration regions are formed as the n-type source/drain regions 5s, 5d on both sides of the third gate electrode 13c in the second P-well 5.

The n-type impurity high-concentration regions 7g, 7h are formed on both sides of the fifth gate electrode 13e in the second n-type offset regions 7e, 7f. The n-type impurity high-concentration regions 7g, 7h and the first and second n-type offset regions 7a, 7b, 7e, 7f constitute the n-type source/drain regions 7s, 7d.

Also, the p-type impurity ion is implanted into the first and third gate electrodes 13a, 13c, and also implanted into the fifth gate electrode 13e through the first gate opening portion 25a. Thus, resistances of the first, third, and fifth gate electrodes 13a, 13c, 13e are lowered, and these electrodes are formed as the conductive patterns.

Then, the resist pattern 61 is removed.

Figure 5M:
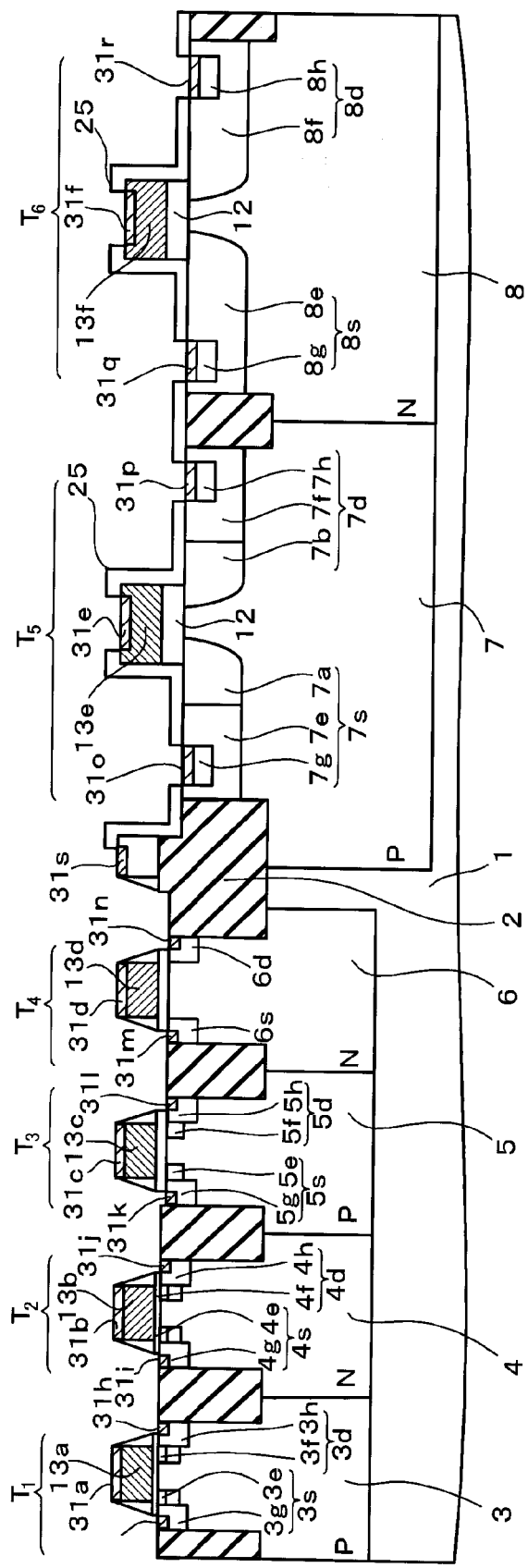

Then, as illustrated in FIG. 5M, the silicide layers 31a to 31f are formed on the first to sixth gate electrodes 13a to 13f by the similar method to that in the second embodiment. At the same time, the silicide layers 31g to 31r are formed on the surfaces of the n-type source/drain regions 3s, 3d, 5s, 5d, 7s, 7d and the p-type source/drain regions 4s, 4d, 6s, 6d, 8s, 8d respectively. Also, a silicide layer 31s is formed on the upper layer of the polysilicon film 13 that is exposed on the element isolation insulating layer 2 in the high-voltage transistor forming area B.

According to the above steps, like the second embodiment, the first, second, and third NMOS transistors $T_1$, $T_3$, $T_5$ and the first, second, and third PMOS transistors $T_2$, $T_4$, $T_6$ are formed.

Figure 5N:
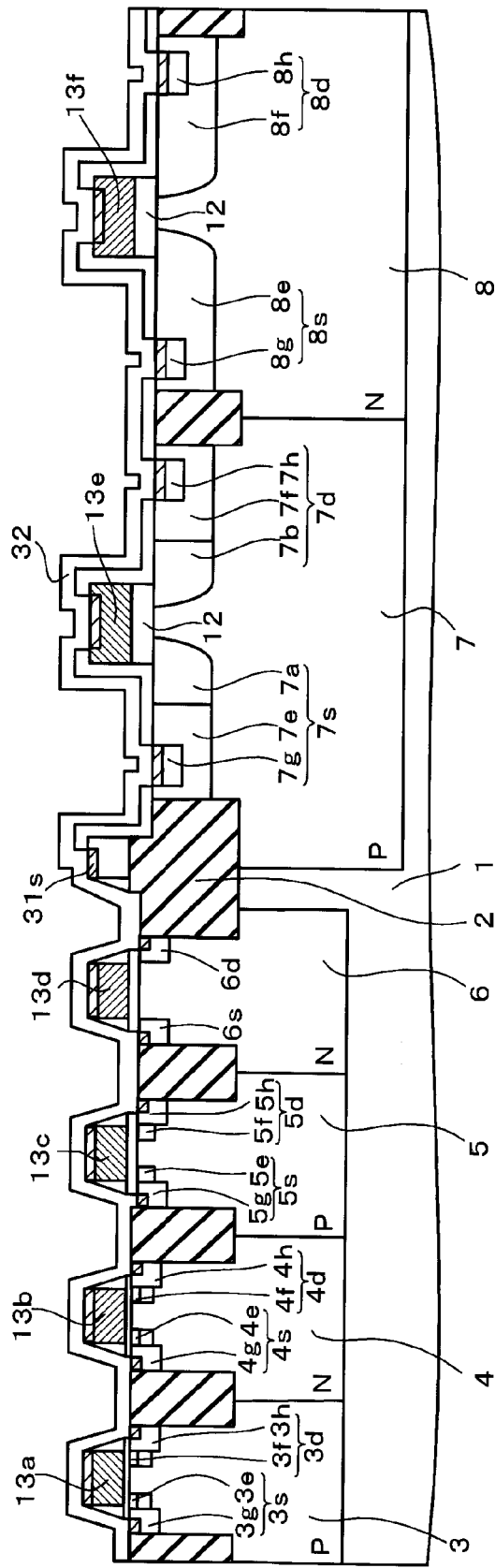

Then, as illustrated in FIG. 5N, the third insulating film 32, e.g., the silicon nitride film for covering the first, second, and third NMOS transistors $T_1$, $T_3$, $T_5$, the first, second, and third PMOS transistors $T_2$, $T_4$, $T_6$, the second insulating film 25, and the like is formed by the plasma CVD method.

Then, as illustrated in FIG. 5O, the first interlayer insulating film 33, and others are formed. These steps are similar to those in the first embodiment.

According to the above steps, the fifth and sixth gate electrodes 13e, 13f being covered with the first insulating film 53 are formed in the high-voltage transistor forming area B, and then the offset regions 7a, 7b, 7e, 7f, 8e, 8f are formed by the ion implantation in the high-voltage transistor forming area B. Thus, the penetration of the ion into the silicon substrate 1 can be prevented by the first insulating film 53 and the fifth and sixth gate electrodes 13e, 13f during the ion implantation for forming the offset regions 7a, 7b, 7e, 7f, 8e, 8f.

After this, the third gate insulating film 12 on both sides of the fifth and sixth gate electrodes 13e, 13f is removed, and then the first insulating film 53 on the polysilicon film 13 is removed. Then, the first to fourth gate electrodes 13a to 13d are formed by patterning the polysilicon film 13 in the low-voltage transistor forming area A.

Also, the insulating film formed on the first to sixth gate electrodes 13a to 13f, the first to third P-wells 3, 5, 7 and the first to third N-well 4, 6, 8 is consist of the second insulating film 25 only. Thus, the sidewalls 27a to 27d, the gate opening portions 25a, 25d, and the S/D contact holes 25b, 25c, 25e, 25f can be formed at the same time by patterning the second insulating film 25. As a result, throughput of forming the sidewalls, the openings, and the holes can be improved in contrast to the first and second embodiments.

Also, in the step of patterning the second insulating film 25, the first insulating film 53 is not present on the fifth and sixth gate electrodes 13e, 13f. Therefore, the formation of the first and second gate opening portions 25a, 25d and the formation of the sidewalls 27a to 27d can be completed substantially at the same time. As a result, the overetching of the element isolation insulating layer 2 can be prevented.

All examples and conditional language recited herein are intended for pedagogical purposes to aid the reader in understanding the invention and the concepts contributed by the inventor to furthering the art, and are to be construed as being without limitation to such specifically recited examples and conditions, not does the organization of such examples in the specification relate to a showing of the superiority and inferiority of the invention. Although the embodiments of the present invention have been described in detail, it should be understood that the various changes, substitutions, alterations could be made hereto without departing from the spirit and scope of the invention.

What is claimed is:

1. A method of manufacturing a semiconductor device comprising:
   forming a first semiconductor pattern whose upper surface is covered with a first insulating film over a first active region of a semiconductor substrate;
   forming a second semiconductor pattern over a second active region of the semiconductor substrate;
   forming a second insulating film over the first insulating film and the first semiconductor pattern and the second semiconductor pattern;
   forming sidewalls on side surfaces of the second semiconductor pattern by etching the second insulating film;
   after forming the sidewalls, forming an opening portion reaching the first semiconductor pattern, in the second insulating film and the first insulating film;
   forming a metal film over the first semiconductor pattern and the second semiconductor pattern respectively; and
   forming a silicide layer over the first semiconductor pattern and the second semiconductor pattern respectively by reacting the first semiconductor pattern and the second semiconductor pattern with the metal film.

2. The method of claim 1, wherein an element isolation insulating layer is formed between the first active region and the second active region.

3. The method of claim 1, wherein the first active region and the first semiconductor pattern are covered with a first mask pattern when the sidewalls are formed, and the second active region and the second semiconductor pattern is covered with a second mask pattern when the opening portion is formed.

4. The method of claim 3, wherein the second mask pattern covers the element isolation insulating layer.

5. The method of claim 4, wherein the first active region and the second active region in the semiconductor substrate are semiconductor regions of same conductivity type.

6. The method of claim 1, wherein the first semiconductor pattern is formed over a first gate insulating film formed over the semiconductor substrate, and the second semiconductor pattern is formed over a second gate insulating film that is formed over the semiconductor substrate and is thinner than the first gate insulating film.

7. The method of claim 1, wherein a width of the first semiconductor pattern is wider than a width of the second semiconductor pattern.

8. The method of claim 1, wherein the opening portion is formed over a part of an upper surface of the first semiconductor pattern.

9. The method of claim 1, further comprising:
   implanting an impurity into the first semiconductor pattern; and
   implanting an impurity into the second semiconductor pattern.

10. The method of claim 1, further comprising:
    introducing an impurity into the first active region by using the first semiconductor pattern as a mask; and
    introducing an impurity into the second active region by using the second semiconductor pattern as a mask.

11. A method of manufacturing a semiconductor device comprising:
    forming a first semiconductor pattern whose upper surface is covered with a first insulating film over a first active region of a semiconductor substrate;
    implanting an impurity into the first semiconductor pattern covered with the first insulating film;
    forming a second insulating film over the first semiconductor pattern covered with the first insulating film;
    forming an opening reaching the first semiconductor pattern, in the second insulating film and the first insulating film;
    forming a metal film over the first semiconductor pattern; and
    forming a silicide layer over the first semiconductor pattern by reacting the first semiconductor pattern with the metal film.

12. The method of claim 11, wherein the first active region is defined by an element isolation insulating layer, and the step of forming the opening portion is executed by using a mask pattern that covers the element isolation insulating layer.

* * * * *